US011808823B2

(12) United States Patent
Guzik et al.

(10) Patent No.: US 11,808,823 B2
(45) Date of Patent: Nov. 7, 2023

(54) DETECTION OF DEVICE DISLOCATION USING POWER AND NON-POWERED DISLOCATION SENSORS

(71) Applicants: Getac Technology Corporation, Taipei (TW); WHP Workflow Solutions, Inc., North Charleston, SC (US)

(72) Inventors: Thomas Guzik, Edina, MN (US); Muhammad Adeel, Edina, MN (US)

(73) Assignees: Getac Technology Corporation, New Taipei (TW); WHP Workflow Solutions, Inc., North Charleston, SC (US)

( * ) Notice: Subject to any disclaimer, the term of this patent is extended or adjusted under 35 U.S.C. 154(b) by 111 days.

(21) Appl. No.: 17/336,954

(22) Filed: Jun. 2, 2021

(65) Prior Publication Data
US 2022/0390526 A1 Dec. 8, 2022

(51) Int. Cl.
*G01R 31/54* (2020.01)
*G06F 1/16* (2006.01)
*H04W 4/80* (2018.01)
*F41C 33/02* (2006.01)
*H04N 23/51* (2023.01)
*F41A 17/06* (2006.01)

(52) U.S. Cl.
CPC ............ *G01R 31/54* (2020.01); *F41C 33/029* (2013.01); *G06F 1/163* (2013.01); *H04N 23/51* (2023.01); *H04W 4/80* (2018.02); *F41A 17/063* (2013.01)

(58) Field of Classification Search
CPC ....... G01R 31/54; F41C 33/029; G06F 1/163; H04N 5/2252; H04W 4/80; F41A 17/063
See application file for complete search history.

(56) References Cited

U.S. PATENT DOCUMENTS 3,530,451 A * 9/1970 Devine ................ G08B 13/149
340/572.1
5,108,019 A * 4/1992 Woodward .............. F41C 33/04
340/568.2

(Continued)

FOREIGN PATENT DOCUMENTS

KR 102067905 B1 1/2020

OTHER PUBLICATIONS

Cloud Connected Guns For Cops that can Recognize Shots & Alert Backup in Realtime, Linus Tech Tips, Messageboard User Tech_Dreamer, Oct. 24, 2014. URL: https://linustechtips.com/topic/238322-cloud-connected-guns-for-cops-that-can-recognize-shots-alert-backup-in-realtime/.

(Continued)

*Primary Examiner* — Brian E Miller
(74) *Attorney, Agent, or Firm* — Han Santos, PLLC

(57) ABSTRACT

An indication from a body-worn device may be received at a user device, in which the indication notifies the user device that the body-worn device has detached from a mounting position. The user device may be a body-worn hub or another body-worn device. A command is then generated at the user device to trigger the body-worn device or another body-worn device to perform an action based at least on the indication. In some instances, the user device may send an event notification for the indication to an event handler on a hub or a server for the event handler to determine whether to perform an action based at least on the event notification.

20 Claims, 9 Drawing Sheets

(56) References Cited

U.S. PATENT DOCUMENTS

| | | | | |
|---|---|---|---|---|
| 5,479,149 A * | 12/1995 | Pike | ............... | F41C 33/0209 |
| | | | | 340/568.1 |
| 5,525,966 A * | 6/1996 | Parish | ............... | G08B 21/02 |
| | | | | 340/568.1 |
| 5,828,301 A * | 10/1998 | Sanchez | ............... | F41C 33/029 |
| | | | | 340/568.1 |
| 5,914,585 A | 6/1999 | Grabon | | |
| 5,991,844 A | 11/1999 | Khosrowpour | | |
| 6,349,201 B1 * | 2/2002 | Ford | ............... | H04B 1/385 |
| | | | | 455/66.1 |
| 6,563,424 B1 * | 5/2003 | Kaario | ............... | G06F 1/163 |
| | | | | 340/572.1 |
| 7,409,557 B2 | 8/2008 | Teppler | | |
| 7,843,329 B2 * | 11/2010 | Shigemori | ............... | A61B 1/00016 |
| | | | | 340/572.8 |
| 7,969,963 B2 | 6/2011 | Duan et al. | | |
| 8,719,452 B1 | 5/2014 | Ding et al. | | |
| 9,124,258 B2 | 9/2015 | Pechaud et al. | | |
| 9,269,239 B1 * | 2/2016 | Jensen | ............... | G08B 5/22 |
| 9,395,432 B2 | 7/2016 | Boyd | | |
| 9,564,043 B2 * | 2/2017 | Sanders | ............... | F41C 33/029 |
| 9,742,221 B2 | 8/2017 | Shinohara | | |
| 9,810,766 B2 | 11/2017 | Boyd | | |
| 9,829,343 B2 | 11/2017 | Sobotka et al. | | |
| 10,370,102 B2 | 8/2019 | Boykin et al. | | |
| 10,403,124 B1 | 9/2019 | Schuler et al. | | |
| 10,673,883 B2 | 6/2020 | Wetterwald et al. | | |
| 11,378,355 B1 * | 7/2022 | Howard | ............... | G08B 5/36 |
| 11,442,173 B2 | 9/2022 | Kim et al. | | |
| 11,457,172 B2 | 9/2022 | Takahashi et al. | | |
| 2003/0095032 A1 * | 5/2003 | Hoshino | ............... | G06K 17/00 |
| | | | | 707/E17.112 |
| 2004/0167990 A1 | 8/2004 | Peer | | |
| 2005/0066567 A1 * | 3/2005 | Newkirk | ............... | F41A 17/063 |
| | | | | 42/70.11 |
| 2005/0229654 A1 * | 10/2005 | Victor | ............... | E05B 73/00 |
| | | | | 70/58 |
| 2006/0056560 A1 | 3/2006 | Aweya et al. | | |
| 2006/0056563 A1 | 3/2006 | Aweya et al. | | |
| 2007/0124979 A1 * | 6/2007 | Newkirk | ............... | F41C 33/029 |
| | | | | 42/70.11 |
| 2008/0204231 A1 * | 8/2008 | Hietanen | ............... | G08B 25/016 |
| | | | | 340/568.1 |
| 2010/0172339 A1 | 7/2010 | Duan et al. | | |
| 2010/0284683 A1 | 11/2010 | Fressola et al. | | |
| 2011/0018998 A1 | 1/2011 | Guzik | | |
| 2012/0304634 A1 | 12/2012 | Ooi et al. | | |
| 2013/0076398 A1 | 3/2013 | Pechaud et al. | | |
| 2013/0138991 A1 | 5/2013 | Reinke et al. | | |
| 2014/0129174 A1 * | 5/2014 | White | ............... | A61B 5/681 |
| | | | | 29/601 |
| 2015/0242608 A1 * | 8/2015 | Kim | ............... | A61B 5/6844 |
| | | | | 726/19 |
| 2015/0254968 A1 * | 9/2015 | Sanders | ............... | F41C 33/029 |
| | | | | 340/539.13 |
| 2016/0086472 A1 * | 3/2016 | Herrera | ............... | F41C 33/029 |
| | | | | 340/539.11 |
| 2016/0100758 A1 * | 4/2016 | Jeong | ............... | G06F 1/1698 |
| | | | | 340/870.07 |
| 2016/0110975 A1 * | 4/2016 | Oppenheimer | ............... | G06F 21/88 |
| | | | | 340/572.1 |
| 2016/0190859 A1 | 6/2016 | Blum et al. | | |
| 2016/0228640 A1 | 8/2016 | Pindado et al. | | |
| 2016/0330573 A1 * | 11/2016 | Masoud | ............... | H04W 12/0431 |
| 2017/0003101 A1 * | 1/2017 | Madrid | ............... | F41C 33/029 |
| 2017/0010062 A1 * | 1/2017 | Black | ............... | F41A 17/063 |
| 2017/0059274 A1 * | 3/2017 | Crist | ............... | F41C 33/0263 |
| 2017/0074617 A1 * | 3/2017 | Stewart | ............... | H04W 4/80 |
| 2017/0160050 A1 * | 6/2017 | Alfaro | ............... | G08B 13/149 |
| 2017/0180536 A1 * | 6/2017 | Stock | ............... | H04W 4/80 |
| 2017/0222676 A1 * | 8/2017 | Piccioni | ............... | H04B 1/3883 |
| 2018/0050800 A1 | 2/2018 | Boykin et al. | | |
| 2018/0070840 A1 * | 3/2018 | Cronin | ............... | A61B 5/7435 |
| 2018/0231349 A1 * | 8/2018 | Wagner | ............... | G08B 5/22 |
| 2019/0033043 A1 | 1/2019 | Piccioni | | |
| 2019/0174208 A1 | 6/2019 | Speicher et al. | | |
| 2019/0268526 A1 | 8/2019 | Sosnovsky et al. | | |
| 2019/0373219 A1 | 12/2019 | Sautner | | |
| 2020/0003511 A1 * | 1/2020 | Deng | ............... | F41A 17/06 |
| 2020/0019682 A1 * | 1/2020 | Lee | ............... | H04L 63/0853 |
| 2020/0027458 A1 | 1/2020 | Torok et al. | | |
| 2020/0217613 A1 * | 7/2020 | Hatcher | ............... | G08B 21/24 |
| 2020/0267503 A1 | 8/2020 | Watkins et al. | | |
| 2020/0272826 A1 | 8/2020 | Hasegawa et al. | | |
| 2020/0304638 A1 | 9/2020 | Jensen | | |
| 2020/0314240 A1 | 10/2020 | Leavitt et al. | | |
| 2020/0327347 A1 | 10/2020 | Arai et al. | | |
| 2020/0355463 A1 | 11/2020 | Piccioni | | |
| 2020/0370863 A1 * | 11/2020 | Wagner | ............... | F41C 33/029 |
| 2020/0396372 A1 * | 12/2020 | Vagelos | ............... | H04N 21/4223 |
| 2021/0005850 A1 | 1/2021 | Thiel et al. | | |
| 2021/0044673 A1 | 2/2021 | MacGabann | | |
| 2021/0080208 A1 * | 3/2021 | Wu | ............... | G08B 25/014 |
| 2021/0088297 A1 * | 3/2021 | Henry | ............... | F41A 17/063 |
| 2021/0132177 A1 | 5/2021 | Srinivas et al. | | |
| 2021/0203168 A1 | 7/2021 | Sharma et al. | | |
| 2021/0263965 A1 | 8/2021 | Li et al. | | |
| 2021/0272437 A1 * | 9/2021 | Piccioni | ............... | B60R 22/10 |
| 2021/0295668 A1 * | 9/2021 | Blanchard | ............... | G06N 3/042 |
| 2022/0101702 A1 * | 3/2022 | Olsen | ............... | A61B 5/6831 |
| 2022/0110504 A1 | 4/2022 | Inglis | | |
| 2022/0295437 A1 | 9/2022 | Maluf et al. | | |
| 2022/0318095 A1 | 10/2022 | Gautam et al. | | |
| 2022/0390526 A1 * | 12/2022 | Guzik | ............... | H04W 4/38 |

OTHER PUBLICATIONS

Miners, Zach. Startup arms cops with Internet-connected 'smart' guns, PC World, Oct. 27, 2014. URL: https://www.pcworld.com/article/2839581/startup-arms-cops-with-internetconnected-smart-guns.html.

Szondy, David. Wireless Yardarm Sensor monitors firearm use in real time, New Atlas, Oct. 27, 2014. URL: https://newatlas.com/yardarm-sensor-firearms/34409/.

Yardarm. Mar. 2021. URL: http://www.yardarmtech.com.

International Patent Application No. PCT/US2022/031647, International Search Report and Written Opinion dated Sep. 28, 2022, 10 pages.

U.S. Appl. No. 17/331,563, Notice of Allowance dated Aug. 3, 2022, 37 pages.

U.S. Appl. No. 17/354,835, Office Action dated Oct. 25, 2022, 38 pages.

U.S. Appl. No. 17/354,835, Notice of Allowance dated Feb. 17, 2023, 18 pages.

U.S. Appl. No. 17/480,989, Office Action dated Mar. 23, 2023, 38 pages.

* cited by examiner

DETECTION OF DEVICE DISLOCATION USING POWER AND NON-POWERED DISLOCATION SENSORS

BACKGROUND

Law enforcement officers generally carry multiple body-worn electronic devices as they perform their law enforcement functions. For example, law enforcement agencies are increasingly mandating that their police officers carry and use portable recording devices, such as a body camera, to record their interactions with the public. The recordings may serve to protect the public from improper policing, as well as protect law enforcement officers from false allegations of police misconduct. Other examples of electronic devices that are carried by a law enforcement officer may include a radio, a smartphone, a biometric monitor, a non-lethal electronic shock weapon, and electronic add-on sensors. For instance, a law enforcement officer's gun may be equipped with a holster sensing device in its grip area that detects whether the officer's gun is holstered or unholstered. However, in some instances, these electronic devices may become detached from the law enforcement officer's clothing or equipment carrier as the law enforcement officer performs his or her duty during the course of a shift. For example, the holster sensing device of the law enforcement officer may become detached from the gun or the gun holster due to wear or malfunction. In another example, the body camera or the radio of the law enforcement officer may be jostled loose or fall off due to the movement of the officer.

SUMMARY

Described herein are techniques for using dislocation sensors to detect that body-worn devices have become detached from mounting positions on the clothing, equipment, or equipment carrier of a person, such as a law enforcement officer. The body-worn device may be equipped with dislocation sensors. For example, a holster sensing device may be equipped with a dislocation sensor that detects whether the holster sensing device is properly attached to a gun or the holster, in addition to a sensor that detects whether a gun is in or out of the holster. In another example, a body-worn device in the form of a body camera or a radio may be equipped with a dislocation sensor that detects whether the device has become detached from a mounting position on the uniform shirt, equipment belt, or protective equipment (e.g., ballistic vest) of the law enforcement officer. The dislocation sensor of a body-worn device may include a switch that is triggered when the body-worn device is detached from a mounting position. In various embodiments, the dislocation sensor of the body-worn device may be powered or non-powered. A powered dislocation sensor means that the dislocation sensor is powered by an energy source (e.g., battery) internal to the body-worn device. On the other hand, a non-power dislocation sensor means that the dislocation sensor is not powered by an energy source internal to the body-worn device.

With respect to a body-worn device that includes a powered version of the dislocation sensor, the switch may be triggered when the body-worn device becomes dislocated, i.e., detached from its mounting position. The triggering of the switch may cause the body-worn device to either send a first signal or stop periodically sending a second signal to a body-worn hub. The first signal may encode a first signal value that is interpreted by the body-worn hub as indicating that the body-worn device is dislocated. The second signal may encode a second signal value that is interpreted by the body-worn hub as indicating that the body-worn device is not dislocated. The signals may be sent by the body-worn sensor to the body-worn hub via a wired communication connection or a wireless communication connection.

The body-worn hub may record the detected dislocation event in a sensor event log for the body-worn device. Additionally, the body-worn hub may perform one or more actions, or trigger one or more body-worn devices to perform one or more actions based on the dislocation event. For example, the body-worn hub may send an event notification regarding the dislocation event to a vehicle hub or a server at a network operations center (NOC). In another example, the body-worn hub may trigger another body-worn device that is a smartphone to display a notification that the body-worn device is detached on a display of the smartphone. Alternatively, the body-worn device may be configured to either send the first signal or stop periodically sending the second signal to an additional body-worn device. Accordingly, the additional body-worn device may perform similar actions as the body-worn hub in response to the dislocation event detected by the body-worn device.

With respect to a body-worn device that includes a non-power version of the dislocation sensor, the dislocation sensor may be configured to become temporarily energized and send a preconfigured return radio signal when an electrically conductive antenna coil is irradiated by an external radio signal from a nearby body-worn hub. The return radio signal may include a unique device identifier of the body-worn device and a signal value that indicates the body-worn device is not dislocated. However, the dislocation sensor may include a switch that is triggered when the body-worn device becomes dislocated, i.e., detached from its mounting position. The triggering of the dislocation sensor may interrupt the electrical conductivity of the antenna coil so that the dislocation sensor will fail to become energized and send out the return radio signal when exposed to the external radio signal.

Since the body-worn hub is configured to periodically broadcast the external radio signals, the body-worn hub may interpret a failure to receive the return radio after a predetermined number of external radio signal broadcasts as an indication that the body-worn device has detached from the mounting position. Accordingly, the body-worn hub may record the detected dislocation event in a sensor event log for the body-worn device, as well as perform the other tasks as described with respect to the powered version of the dislocation sensor. Alternatively, an additional body-worn device may be configured to periodically send out the external radio signals, and interpret a failure to receive the return radio after a predetermined number of external radio signal broadcasts as an indication that the body-worn device has detached from the mounting position. Accordingly, the additional body-worn device may perform similar actions as the body-worn hub in response to the dislocation event detected by the body-worn device.

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures, in which the left-most digit(s) of a reference number identifies the figure in which the reference number first appears. The use of the same reference numbers in different figures indicates similar or identical items.

DETAILED DESCRIPTION

Figure 1:
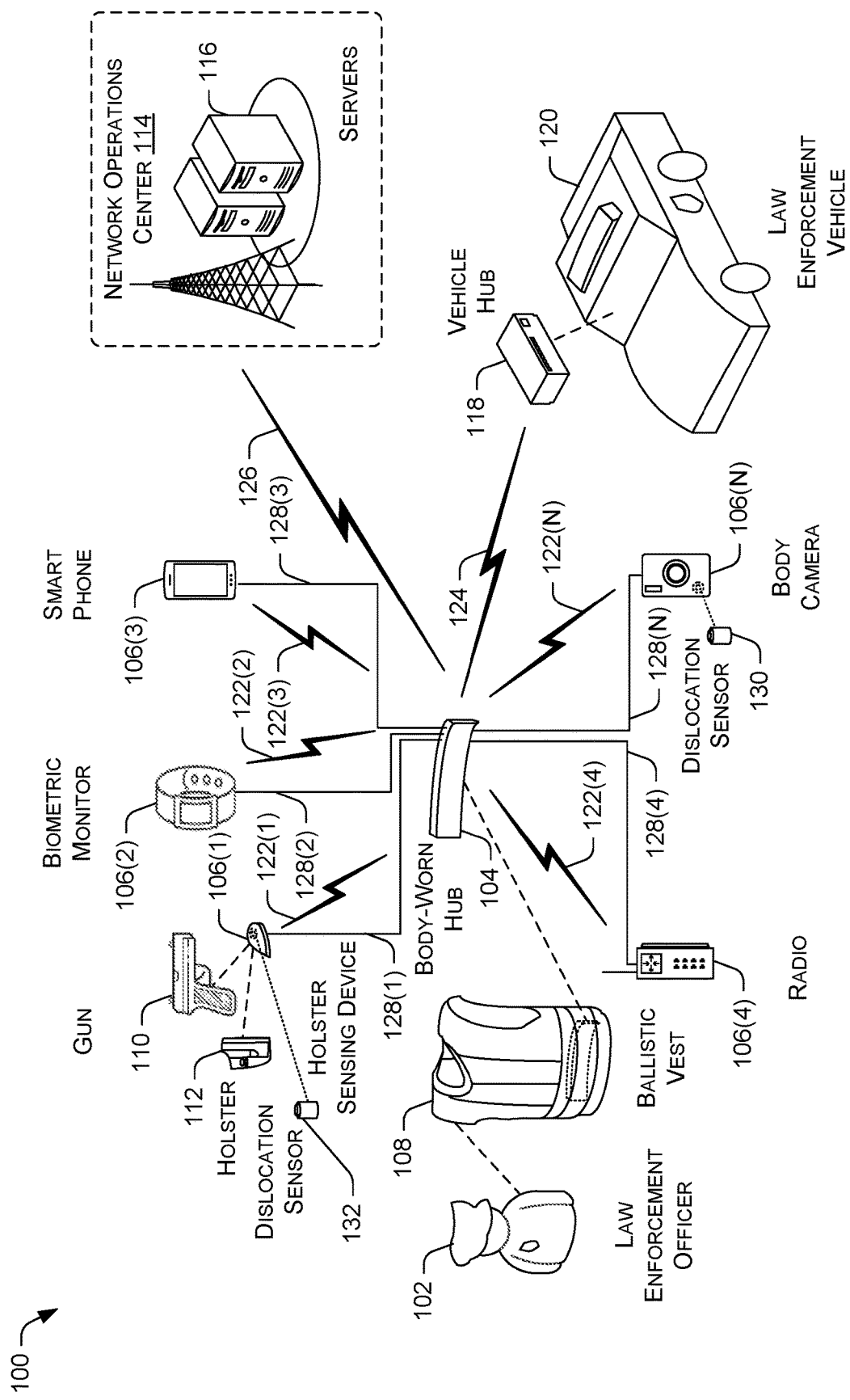
FIG. 1 illustrates an example environment for detecting the device dislocation of a body-worn device using powered and non-powered dislocation sensors.

Described herein are techniques for using dislocation sensors to detect that body-worn devices have become detached from mounting positions on the clothing, equipment, or equipment carrier of a person, such as a law enforcement officer. The body-worn device may be equipped with dislocation sensors. For example, a holster sensing device may be equipped with a dislocation sensor that detects whether the holster sensing device is properly attached to a gun or the holster, in addition to a sensor that detects whether a gun is in or out of the holster. In another example, a body-worn device in the form of a body camera or a radio may be equipped with a dislocation sensor that detects whether the device has become detaching from a mounting position on the uniform shirt or equipment belt of the law enforcement officer. The dislocation sensor of a body-worn device may include a switch that is triggered when the body-worn device is detached from a mounting position. In various embodiments, the dislocation sensor of the body-worn device may be powered or non-powered. A powered dislocation sensor means that the dislocation sensor is powered by an energy source (e.g., a battery) internal to the body-worn device. On the other hand, a non-power dislocation sensor means that the dislocation sensor is not powered by an energy source internal to the body-worn device.

In some embodiments, a body-worn device may comprise a transceiver, a dislocation sensor that is triggered when the body-worn device detaches from a mounting position, one or more processors, and a memory having instructions stored therein. The instructions may be executed by the one or more processors to cause the one or more processors to perform acts. The acts may include detecting that the dislocation sensor is triggered by the body-worn device detaching from the mounting position, as well as directing the transceiver to send an event notification to a user device indicating that the body-worn device has detached from the mounting position.

In additional embodiments, a body-worn device may comprise a microchip that includes a wireless transmitter. The wireless transmitter may be configured to send out a preconfigured radio signal in response to receiving electrical power. The body-worn device may further comprise an antenna coil that is configured to be energized by an external radio signal broadcasted by a wireless transceiver of a user device to provide the electrical power to the wireless transmitter and to broadcast the preconfigured radio signal from the wireless transmitter, as well as a dislocation sensor that includes a switch. The switch may be configured to interrupt an electrical circuit of the antenna coil when the body-worn device detaches from a mounting position.

In further embodiments, an indication from a body-worn device may be received at a user device, in which the indication notifies the user device that the body-worn device has detached from a mounting position. The user device may be a body-worn hub or another body-worn device. A command is then generated at the user device to trigger the body-worn device or another body-worn device to perform an action based at least on the indication. In some instances, the user device may send an event notification for the indication to an event handler on a hub or a server for the event handler to determine whether to perform an action based at least on the event notification The use of the dislocation sensors on body-worn devices to detect whether body-worn devices have become detached from mounting positions on the clothing or equipment carriers of law enforcement officers may ensure that such body-worn devices are not accidentally jostled loose or dropped without the law enforcement officers becoming aware of the problems. As a result, the use of the dislocation sensors may help to ensure that the body-worn devices are mounted correctly and able to provide vital information when such information is needed the most. Example implementations are provided below with reference to FIGS. 1-8.

Example Environment

FIG. 1 illustrates an example environment for detecting the device dislocation of a body-worn device using powered and non-powered dislocation sensors. The environment 100 may include a law enforcement officer 102 that is equipped with a body-worn hub 104 and multiple body-worn devices 106(1)-106(N). In some embodiments, the body-worn hub 104 may be a standalone device that is worn by the law enforcement officer 102. In other embodiments, the body-worn hub 104 may be integrated into a garment or a piece of equipment that is worn by the law enforcement officer 102. For example, the body-worn hub 104 may be integrated into a ballistic vest 108 that is worn by the law enforcement officer 102. The body-worn device 106(1)-106(N) may include various devices that are carried by the law enforcement officer 102. For example, the body-worn device 106(1) may be a holster sensing device that is attached to a gun 110 or a holster 112 for the gun 110, such that the holster sensing device may detect whether the gun 110 is holstered in or unholstered from the holster 112. The body-worn device 106(2) may be a biometric monitor (e.g., a smartwatch) that monitors the vital signs of the law enforcement officer 102, such as body temperature, blood pressure, heart rate, etc. The body-worn device 106(3) may be a smartphone that is carried by the law enforcement officer 102. The body-worn device 106(4) may be a radio that the law enforcement officer 102 uses to communicate with a network operations center (NOC) 114. The NOC 114 may include servers 116 that implement a computer-assisted dispatch platform, a data processing platform, and a data file storage platform. For example, the NOC 114 may be a part of a police station or an emergency assistance dispatch center. The servers 116 may be physical servers located at the NOC 114 or virtual servers that are implemented in a cloud. The body-worn device 106(N) may be a body camera that is capable of capturing audiovisual recording, e.g., video, of scenes and events encountered by the law enforcement officer 102.

Each of the body-worn devices 106(1)-106(N) may have short-range wireless communication capabilities, such as Bluetooth, UWB, Wi-Fi, etc., and/or long-range wireless communication capabilities, such as cellular, satellite, etc. In some instances, a body-worn device may be capable of using the short-range wireless communication capabilities to communicate with another body-worn device or a hub, such as the body-worn hub 104. In other instances, a body-worn device may be capable of using the long-range wireless communication capabilities to communicate with the hub or the servers 116 of the NOC 114. Additionally, each of the body-worn devices 106(1)-106(N) may be equipped with an electrically conductive coupling port that enables the device to send power to and receive power from another device, as well as exchange communication with another device. For example, the electrically conductive coupling port may be a mating receptacle that is configured to accept a mating plug of an electrically conductive wired connector, in which the wired connector includes a set of one or more electrically conductive wires or cables sufficient to complete an electrical circuit between two devices. However, in other implementations, the mating receptacle and plug may be substituted with other detachable electrical connection mechanisms, such as a magnetic connection mechanism. In some embodiments, the body-worn device may use the electrically conductive coupling port to send and receive communication that is encoded using digital and/or analog signals.

The body-worn hub 104 may have similar short-range and long-range wireless communication capabilities. In some instances, the body-worn hub 104 may be capable of using the short-range wireless communication capabilities to communicate with another body-worn device or a remote hub, such as the vehicle hub 118 in the law enforcement vehicle 120. For instance, the body-worn hub 104 may establish short-range wireless communication links 122(1)-122(N) with the body-worn devices 106(1)-106(N), respectively. The body-worn devices 106(1)-106(N) and the body-worn hub 104 may use the short-range wireless communications links 122(1)-122(N) to exchange communication. For example, the body-worn devices 106(1)-106(N) may use the short-range wireless communications links 122(1)-122(N) to send event notifications of events detected or recorded by the sensors of the body-worn devices 106(1)-106(N) to the body-worn hub 104. Conversely, the body-worn hub 104 may use the short-range wireless communications links 122(1)-122(N) to send commands to the body-worn devices 106(1)-106(N) that trigger one or more of the body-worn devices 106(1)-106(N) to perform one or more actions in response to events that are detected.

As examples, the events that are detected or recorded by the sensors may include the holster sensing device 106(1) detecting that a gun 110 of the law enforcement officer 102 is unholstered or holstered, an accelerometer in the smartphone 106(3) detecting that the officer is running, walking, or remaining still for a predetermined time period, the biometric monitor 106(2) detecting that the heart rate of law enforcement officer 102 exceeding or falling below a predetermined rate threshold, an impact sensor in the ballistic vest 108 detecting an impact, and/or so forth. Thus, the events that are detected may include discrete events, such as a gun being unholstered or holstered, or a series of continuous events, such as a series of heart rate readings or body temperature readings. Further, the event notification for an event may be in the form of a data packet that includes one or more predetermined encoded values that correspond to the occurrence of the event.

In another instance, the body-worn hub 104 may establish a short-range wireless communication link 124 with the vehicle hub 118, so that communications may be exchanged between the body-worn hub 104 and the vehicle hub 118. For example, the body-worn hub 104 may use the short-range wireless communication link 124 to send event notifications of events detected or recorded by the sensors of the body-worn devices 106(1)-106(N) to the vehicle hub 118, such as for data backup purposes. Conversely, the vehicle hub 118 may use the short-range wireless communication link 124 to send commands to the body-worn hub 104. The commands may trigger one or more of the body-worn devices 106(1)-106(N) that are connected to the body-worn hub 104 to perform one or more actions in response to events that are detected. In other instances, the body-worn hub 104 may be capable of using the long-range wireless communication capabilities to communicate with a remote hub, such as the vehicle hub 118, or the servers 116 of the NOC 114. For instance, the body-worn hub 104 may establish a long-range wireless communication link 126 with the servers 116 of the NOC 114. In such an instance, the long-range wireless communication link 126 may be used by the body-worn hub 104 to send event notifications of events detected or recorded by the sensors of the body-worn devices 106(1)-106(N) to the servers 116 of the NOC 114. Conversely, the servers 116 may use the long-range wireless communication link 126 to send commands to the body-worn hub 104. The commands may trigger one or more of the body-worn devices 106(1)-106(N) that are connected to the body-worn hub 104 to perform one or more actions in response to events that are detected.

Additionally, the body-worn hub 104 may be equipped with a set of electrically conductive coupling ports that are similar to those featured on the body-worn devices 106(1)-106(N), in which a coupling port is a receptacle that may accept the mating plug of an electrically conductive wired connector that connects the body-worn hub to a body-worn device. However, in other implementations, the set of mating receptacles and plugs may be substituted with other detachable connection mechanisms, such as a magnetic connection mechanism. In this way, the body-worn hub 104 may send power to and receive power from the body-worn devices 106(1)-106(N), as well as exchange communication with the body-worn devices 106(1)-106(N). For example, the body-worn hub 104 may be connected to the body-worn devices 106(1)-106(N) via respective electrically conductive wired connectors 128(1)-128(N).

In some embodiments, the body-worn hub 104 may be configured such that the hub will automatically stop using wireless communication with a body-worn device and default to using wired communication when an electrically conductive wired connection is made between the body-worn hub and the body-worn device. The wired communication may enable at least the same data to be exchanged between the body-worn hub 104 and the body-worn device as the wireless communication. For example, when a wired communication link is established between the body-worn hub 104 and the holster sensing device 106(1) via the wired connector 128(1), the body-worn hub 104 may automatically terminate an existing wireless communication link 122(1) between the body-worn hub 104 and the holster sensing device 106(1). However, when the electrically conductive wired connection between the body-worn hub and the body-worn device is disconnected, the body-worn hub 104 may automatically switch to using wireless communication with the body-worn device. For example, when the wired communication link between the body-worn hub 104 and the holster sensing device 106(1) is terminated due to the disconnection of the wired connector 128(1), the body-worn hub 104 may reestablish the wireless communication link 122(1) with the holster sensing device 106(1).

The body-worn hub 104 may process at least one event notification that the hub receives from one or more body-worn devices, such as one or more of the body-worn devices 106(1)-106(N), to determine whether to trigger the performance of actions by at least one body-worn device of the body-worn devices 106(1)-106(N). In some embodiments, the body-worn hub 104 may include a software event handler that processes event notifications and generates commands for the connected body-worn devices. For example, the body-worn hub 104 may trigger the body camera 106(N) of a law enforcement officer 102 to start a video recording when the body-worn hub 104 is notified by the holster sensing device 106(1) that the officer's gun is unholstered.

In additional embodiments, at least some of the body-worn devices 106(1)-106(N) may be equipped with dislocation sensors. For example, the body camera 106(N) may be equipped with a powered dislocation sensor 130 that is configured to sense whether the body camera 106(N) is attached to or detached from a particular mounting position on a piece of clothing (e.g., a uniform shirt) or an equipment carrier (e.g., the ballistic vest 108). In another example, the holster sensing device 106(1) may be equipped with a non-powered dislocation sensor 132 that is configured to sense whether the holster sensing device 106(1) is attached to or detached from a mounting position on the gun 110 or the holster 112.

With respect to a powered version of the dislocation sensor, such as the dislocation sensor 130, a switch of the sensor may be triggered when the body-worn device becomes dislocated, i.e., detached from its mounting position. The triggering of the switch may cause the body-worn device to either send a first signal or stop periodically sending a second signal to the body-worn hub 104. The first signal may encode a first signal value that is interpreted by the body-worn hub 104 as indicating that the body-worn device is dislocated. The second signal may encode a second signal value that is interpreted by the body-worn hub as indicating that the body-worn device is not dislocated. The signals may be sent by the body-worn sensor to the body-worn hub 104 via a wired communication connection or a wireless communication connection.

In turn, the body-worn hub 104 may record the detected dislocation event in a sensor event log for the body-worn device. Additionally, the body-worn hub 104 may perform one or more actions, or trigger one or more body-worn devices to perform one or more actions based on the dislocation event. For example, the body-worn hub 104 may send an event notification regarding the dislocation event to the vehicle hub 118 or a server 116 at a network operations center (NOC) 114. In some embodiments, the vehicle hub 118 may also have long-range wireless communication capabilities to communicate with the server 116, so that the vehicle hub 118 may relay communications from other devices and hubs to the server 116, and vice versa. In another example, the body-worn hub 104 may trigger another body-worn device, such as the smartphone 106(3), to display a notification that the body-worn device is detached on a display of the smartphone. Alternatively, the body-worn device may be configured to either send the first signal or stop periodically sending the second signal to an additional body-worn device, such as the smartphone 106(3). For example, the body-worn device may use a short-range wireless communication connection between the body-worn device and the smartphone 106(3) to send the signals. Accordingly, the additional body-worn device may perform similar actions as the body-worn hub in response to the dislocation event detected by the body-worn device.

With respect to a body-worn device that includes a non-power version of the dislocation sensor, such as the non-powered dislocation sensor 132, the dislocation sensor may be configured to become temporarily energized and send a preconfigured return radio signal when an electrically conductive antenna coil is irradiated by an external radio signal from the body-worn hub 104. The return radio signal may include a unique device identifier of the body-worn device and a signal value that indicates the body-worn device is not dislocated. However, the dislocation sensor may include a switch that is triggered when the body-worn device becomes dislocated, i.e., detached from its mounting position. The triggering of the dislocation sensor may interrupt the electrical conductivity of the antenna coil so that the dislocation sensor will fail to become energized and send out the return radio signal when exposed to the external radio signal.

Since the body-worn hub 104 is configured to periodically broadcast the external radio signals, the body-worn hub 104 may interpret a failure to receive the return radio signal after a predetermined number of external radio signal broadcasts as an indication that the body-worn device has detached from the mounting position. Accordingly, the body-worn hub 104 may record the detected dislocation event in a sensor event log for the body-worn device, as well as perform the other tasks similar to those described with respect to the powered version of the dislocation sensor. Alternatively, an additional body-worn device, such as the smartphone 106(3), may be configured to periodically send out the external radio signals, and interpret a failure to receive the return radio after a predetermined number of external radio signal broadcasts as an indication that the body-worn device has detached from the mounting position. Accordingly, the additional body-worn device may perform similar actions as the body-worn hub 104 in response to the dislocation event detected by the body-worn device.

Example Body-Worn Device Components

Figure 2:
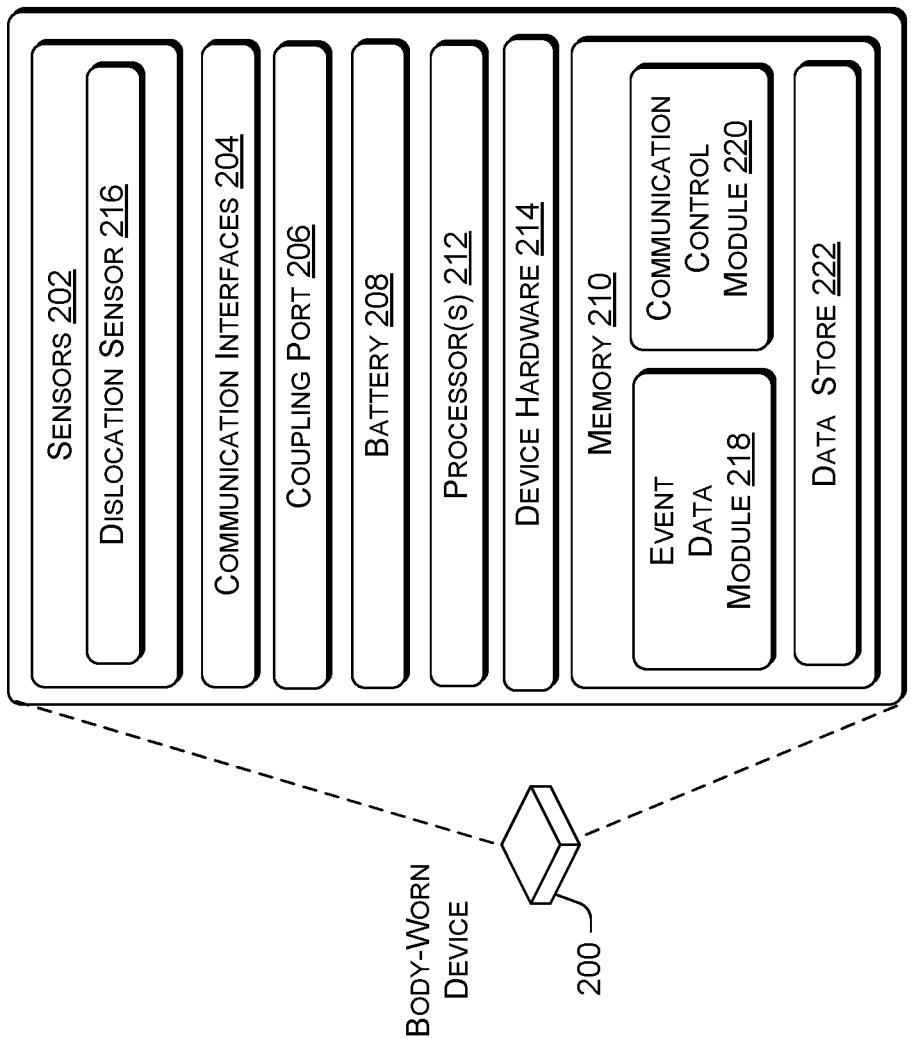
FIG. 2 is a block diagram showing various components of a body-worn device that includes a dislocation sensor for detecting whether the body-worn device is detached from a mounting position.
Figure 3:
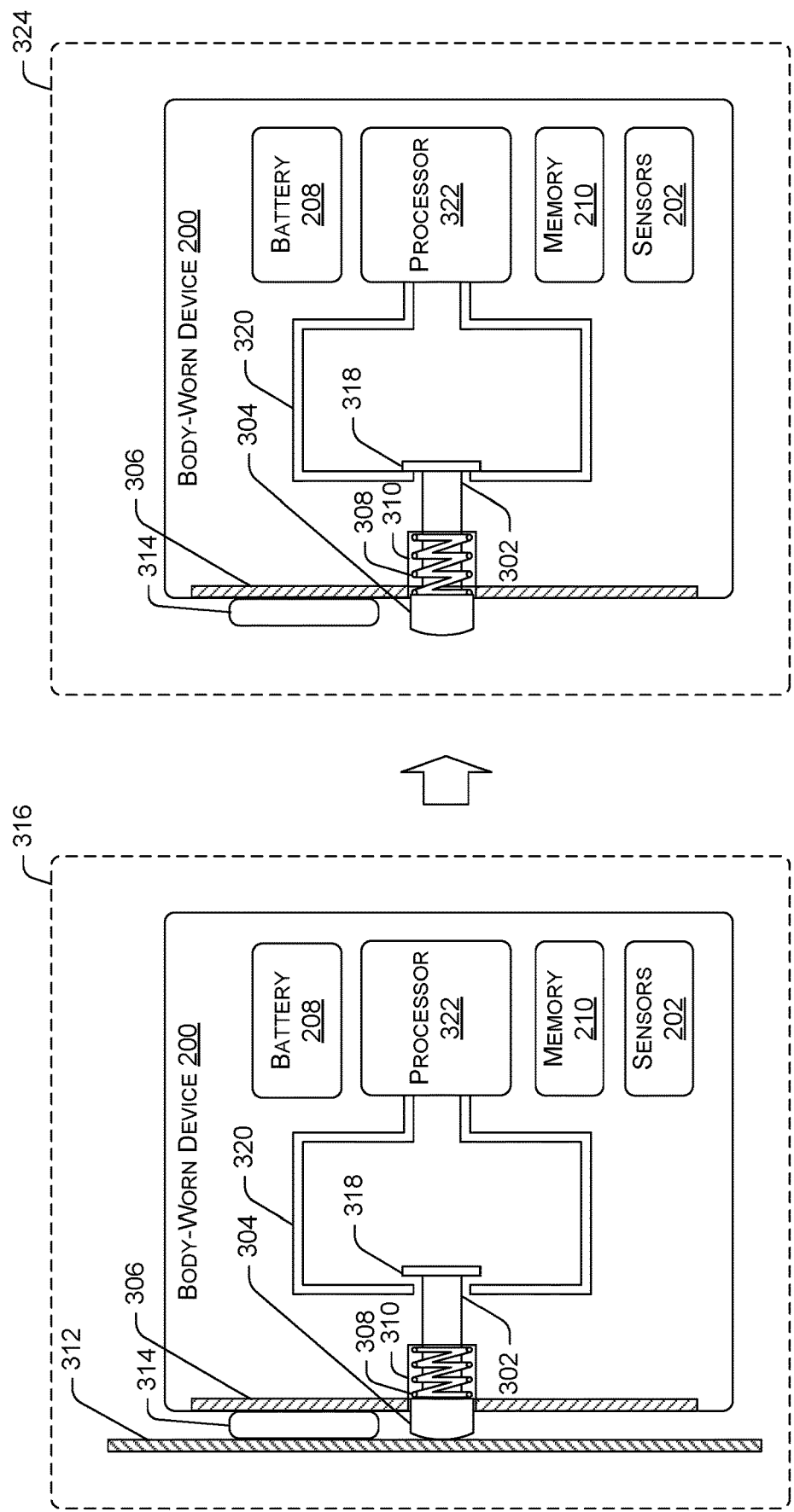
FIG. 3 depicts illustrations of a powered dislocation sensor of a body-worn device that is configured to electrically complete an electrical circuit when the body-worn device is detached from a mounting position.

FIG. 2 is a block diagram showing various components of a body-worn device that includes a dislocation sensor for detecting whether the body-worn device is detached from a mounting position. The body-worn device 200 may be equipped with one or more sensors 202, communication interfaces 204, an electrically conductive coupling port 206, a battery 208, memory 210, one or more processors 212, and device hardware 214. The sensors 202 may include a compass, an accelerometer, one or more pressure sensors, a global positioning system (GPS) sensor, an audio sensor, a video sensor, a dislocation sensor 216, and/or so forth. The communication interfaces 204 may include short-range wireless transceivers (e.g., Bluetooth, UWB, Wi-Fi, and/or so forth) and long-range wireless transceivers (e.g., cellular, satellite, and/or so forth) that enable the body-worn device 200 to wirelessly communicate with other devices. The electrically conductive coupling port 206 may be configured to accept an electrically conductive wired connector. The wired connector may be used by the body-worn device 200 to receive power input to the body-worn device 200 from an external source, output power from the body-worn device 200 to an external load, as well as perform wired communication.

The memory 210 may be implemented using computer-readable media, such as computer storage media. Computer-readable media includes, at least, two types of computer-readable media, namely computer storage media and communications media. Computer storage media includes volatile and non-volatile, removable, and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage, or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanisms.

The device hardware 214 may include user interface hardware, such as physical buttons, a gesture recognition mechanism, or a voice activation mechanism. The device hardware 214 may further include signal converters, antennas, modems, hardware decoders and encoders, graphic processors, digital signal processors, microprocessors, power routing circuitry, microchips, and/or so forth. The device hardware 214 may enable the body-worn device 200 to exchange wired or wireless communication with other devices via the communication interfaces 204, as well as receive power or output power via the electrically conductive coupling port 206 based on software instructions.

The processors 212 and the memory 210 of the body-worn device 200 may implement an event data module 218 and a communication control module 220. These modules may include routines, program instructions, objects, and/or data structures that perform particular tasks or implement particular abstract data types. The memory 210 may further store software (e.g., drivers, applications, firmware, etc.) that support various functionalities of the body-worn device 200, such as software that are executed by the processors 212 to support the establishment of wired and wireless communication links. The memory 210 may also provide a data store 222 that is capable of storing event data. The event data may include sensor data captured by the sensors 202, associated metadata for the sensor data, the corresponding event notification, and/or so forth. In some embodiments, an operating system may also be implemented via the one or more processors 212 and the memory 210 to perform various functions, as well as provide an execution environment that supports the executions of applications and modules.

The event data module 218 may send event notifications of detected events to the body-worn hub 104, the vehicle hub 118, or the servers 116 of the NOC 114. The event notification provided by the event data module 218 may include data such as the time and date of the detected event, a device identifier of the body-worn device 200, the sensor data recorded by a sensor of the body-worn device 200 with respect to the detected event, and/or so forth. For example, when the body-worn device 200 is a holster sensing device associated with a gun, the sensor data recorded by the body-worn device may include the time and date that the gun is holstered or unholstered. In another example, when the body-worn device is a body camera, the sensor data recorded by the body-worn device 200 may include the times and dates that the body camera started recording or stopped recording, as well as the audio and/or video footage recorded by the body camera for the event. In an additional example, the event notification may include an indication that the body-worn device has detached from a mounting position, in which the indication also includes information such as the time and date of the detachment, a device identifier of the body-worn device 200, and/or so forth.

The event data module 218 may send the event notifications to the body-worn hub 104 via available wired communication or alternatively via short-range wireless communication. However, event notifications that are destined for the vehicle hub 118 or the servers 116 are sent via short-range or long-range wireless communication. In turn, the event data module 218 may receive commands for the body-worn hub 104 to perform specific actions. For example, such actions may include activating or deactivating one or more specific sensors, built-in functions, software applications, hardware components, and/or so forth of the body-worn hub 104.

In some embodiments in which the dislocation sensor 216 is a powered sensor, an event notification that is sent by the event data module 218 may be an indication that the body-worn device has detached from a mounting position when the dislocation is sensed by the dislocation sensor. In one embodiment of the powered dislocation sensor 216 shown in FIG. 3, the dislocation sensor 216 may include a switch assembly (e.g., a microswitch) that comprises a sensor shaft 302 and a sensor head 304 that protrudes from a casing 306 of the body-worn device 200. The switch assembly may further include an elastic member 308 (e.g., a spring) that encircles the sensor shaft 302 and contacts the sensor head 304 and a bottom of a shaft housing 310. In this way, the elastic member 308 may be compressed when the sensor head 304 is pressed against a surface 312 at a mounting position. For example, the surface 312 may be the clothing surface of a garment or the surface of an equipment carrier, such as an accessory belt, that is worn by a person (e.g., a law enforcement officer). The body-worn device 200 may be removably attached to the garment or equipment carrier by an attachment apparatus 314, such as a clip, a stud, an adhesive, adhesive tape, or some other attachment mechanism.

As shown in view 316, the attachment of the body-worn device 200 to the surface at the mounting position by the attachment apparatus may, in addition to compressing the elastic member, also bias an electrically conductive connector portion 318 that is fixed to the sensor shaft 302 away from a gap in an electrical circuit 320. The movement of the electrically conductive connector portion 318 away from the gap in the electrical circuit 320 interrupts the electrical circuit 320. The electrical circuit 320 may be a circuit that is otherwise connected directly, or indirectly via one or more other electrical circuit components, to two different electrically conductive leads of a processor 322 (e.g., one of the processors 212). For example, the conductive leads may include two input signal leads or alternatively, one signal input pin and one ground pin.

As shown in view 324, when the body-worn device 200 dislocates from the mounting position on the surface 312, the tension in the elastic member 308 may be completely or partially released so that the sensor head 304 is urged further outside of the casing 306 by the elastic member 308. Further, this movement of the sensor head 304 also moves to the electrically conductive connector portion 318 via the connecting sensor shaft 302 so that the electrically conductive connector portion 318 makes contact with the conductive ends of the electrical circuit 320 at the gap to complete the electrical circuit 320. Thus, the processor 322 may be configured to sense the interruption or completion of the electrical circuit 320 by the movement of the electrically conductive connector portion 318 and notify the event data module 218 of the interruption, either directly or indirectly via one or more other processors of the processors 212.

In turn, the event data module 218 may be configured to interpret the lack of a completed electrical circuit 320 as an indication that the body-worn device 200 is attached at the mounting position. Conversely, the event data module 218 may be configured to interpret the completion of the electrical circuit 320 as an indication that the body-worn device 200 is detached from the mounting position. Accordingly, the event data module 218 may direct the communication interfaces 204 (e.g., a transceiver) of the body-worn device 200 to send out an event notification when the electrical circuit 320 is completed, in which the event notification may indicate that the body-worn device 200 is detached from the mounting position. For example, the event notification may include a device identifier of the body-worn device, device information such as manufacturer, model, and/or version information, data regarding the time and/or the date that the dislocation occurred, and/or so forth.

Figure 4:
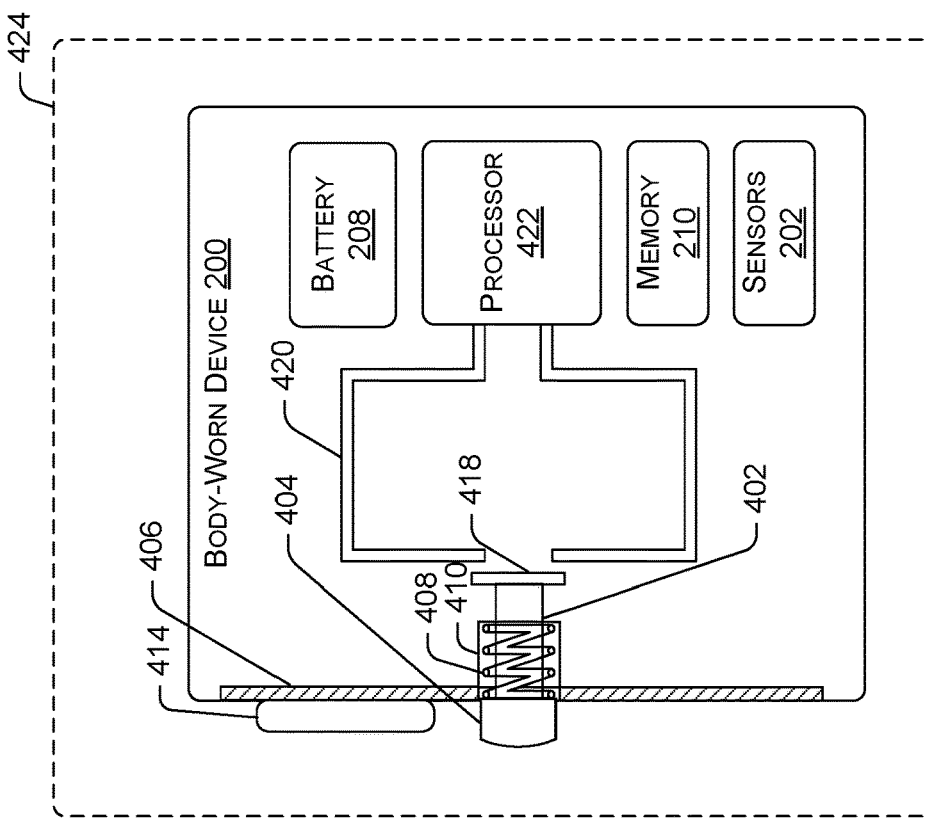
FIG. 4 depicts illustrations of a powered dislocation sensor of a body-worn device that is configured to electrically interrupt an electrical circuit when the body-worn device is detached from a mounting position.
Figure 4:
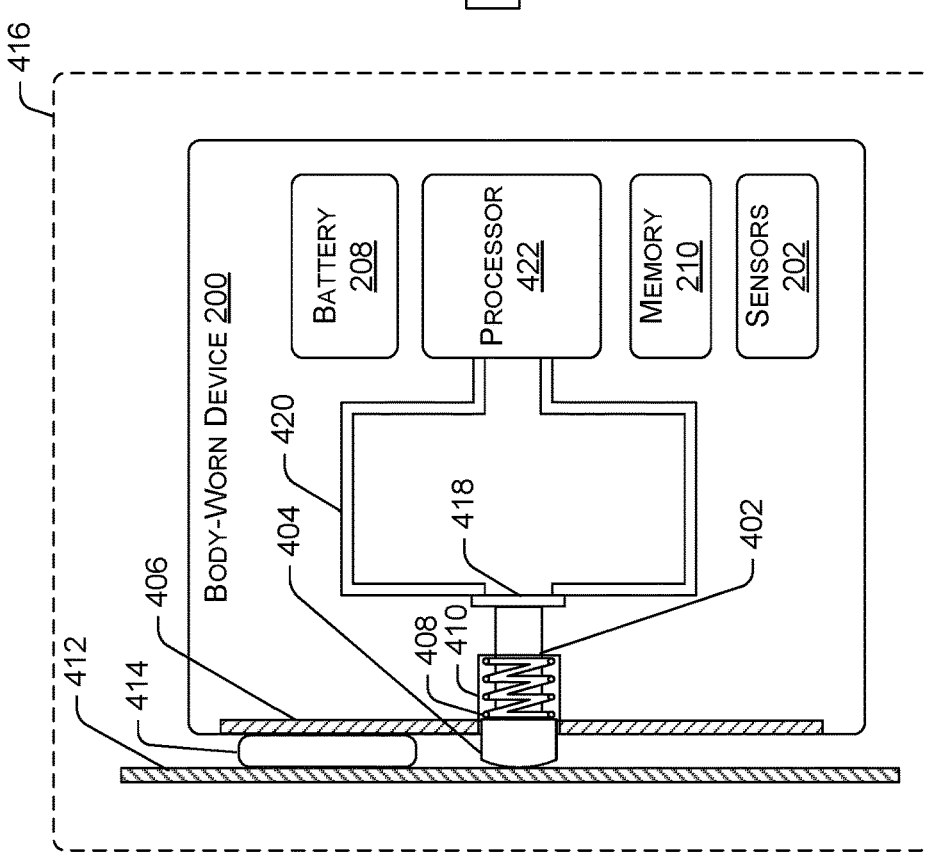
Figure 5:
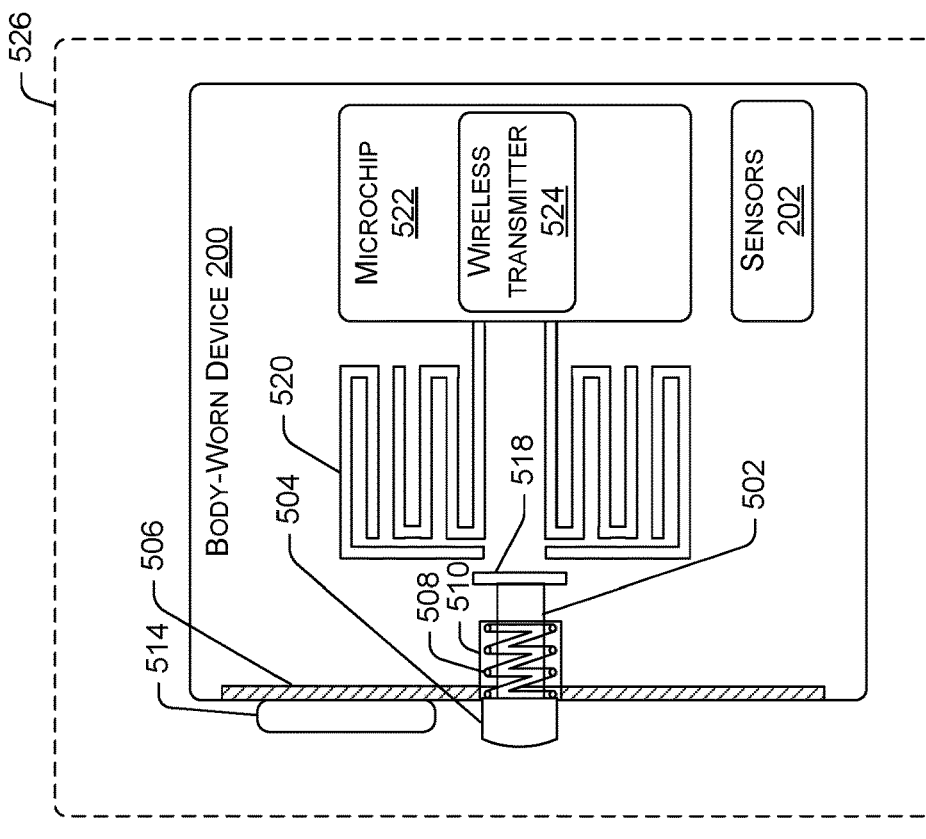
FIG. 5 depicts illustrations of a non-powered dislocation sensor of a body-worn device that is configured to electrically interrupt an antenna coil of the dislocation sensor when the body-worn device is detached from a mounting position.
Figure 5:
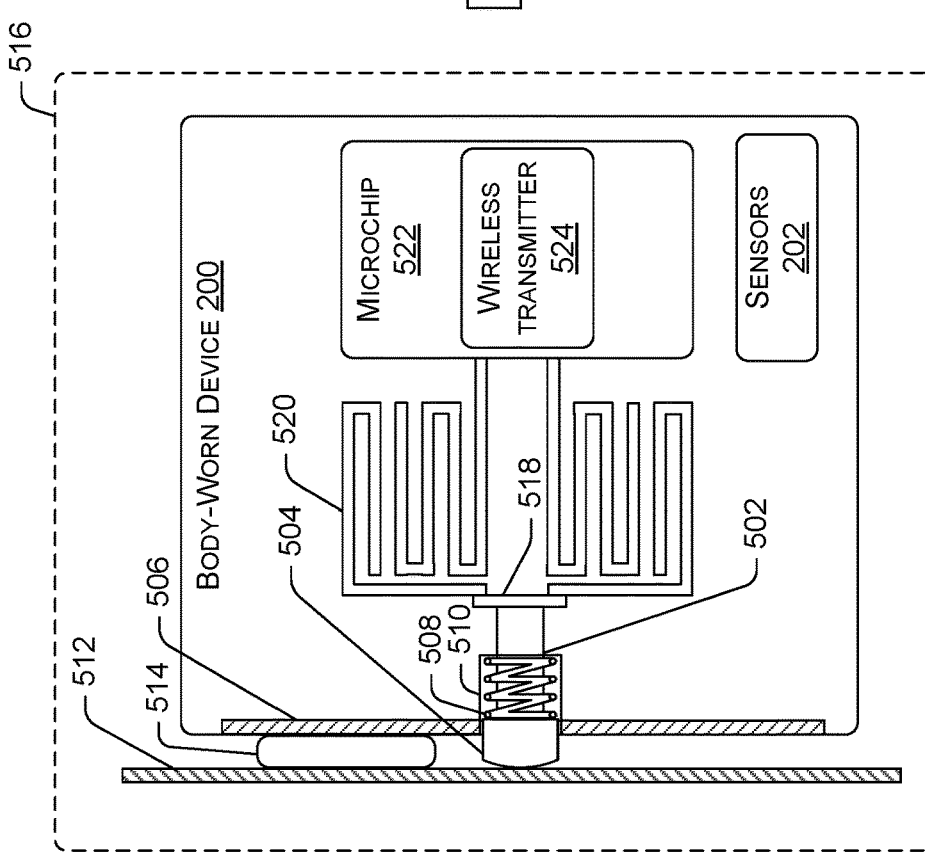

In another embodiment of the powered dislocation sensor 216 shown in FIG. 4, the dislocation sensor 216 may include a switch assembly (e.g., a microswitch) that comprises a sensor shaft 402 and a sensor head 404 that protrudes from a casing 406 of the body-worn device 200. The switch assembly may further include an elastic member 408 (e.g., a spring) that encircles the sensor shaft 402 and contacts the sensor head 404 and a bottom of a shaft housing 410. In this way, the elastic member 408 may be compressed when the sensor head 404 is pressed against a surface 412 at a mounting position. For example, the surface 412 may be the clothing surface of a garment or the surface of an equipment carrier, such as an accessory belt, that is worn by a person (e.g., a law enforcement officer). The body-worn device 200 may be removably attached to the garment or equipment carrier by an attachment apparatus 414, such as a clip, a stud, an adhesive, adhesive tape, or some other attachment mechanism.

As shown in view 416, the attachment of the body-worn device 200 to the surface at the mounting position by the attachment apparatus may, in addition to compressing the elastic member, also bias an electrically conductive connector portion 418 that is fixed to the sensor shaft 402 onto the conductive gap ends of an electrical circuit 420. The movement of the electrically conductive connector portion 418 onto the conductive gap ends of the electrical circuit 420 completes the electrical circuit 320. The electrical circuit 420 may be a circuit that is otherwise connected, directly or indirectly via one or more other electrical circuit components, to two different electrically conductive leads of a processor 422 (e.g., one of the processors 212). For example, the conductive leads may include two input signal leads or alternatively, one signal input pin and one ground pin.

As shown in view 424, when the body-worn device 200 dislocates from the mounting position on the surface 412, the tension in the elastic member 308 may be completely or partially released so that the sensor head 404 is urged further outside of the casing 406 by the elastic member 408. Further, this movement of the sensor head 404 also moves to the electrically conductive connector portion 418 via the connecting sensor shaft 402 so that the electrically conductive connector portion 418 disconnects from the conductive ends of the electrical circuit 420 at the gap to interrupt the electrical circuit 420. Thus, the processor 422 may be configured to sense the interruption or completion of the electrical circuit 420 by the movement of the electrically conductive connector portion 418 and notify the event data module 218 of the interruption, either directly or indirectly via one or more other processors of the processors 212.

In turn, the event data module 218 may be configured to interpret the completed electrical circuit 420 as an indication that the body-worn device 200 is attached at the mounting position. Conversely, the event data module 218 may be configured to interpret the interruption of the electrical circuit 420 as an indication that the body-worn device 200 is detached from the mounting position. Accordingly, the event data module 218 may direct the communication interfaces 204 (e.g., a transceiver) of the body-worn device 200 to send out an event notification when the electrical circuit 420 is interrupted, in which the event notification may indicate that the body-worn device 200 is detached from the mounting position.

In additional embodiments in which the dislocation sensor 216 is a non-powered sensor, the dislocation sensor 216 may be configured to use a preconfigured radio signal to indicate to another device whether the body-worn device 200 is attached or dislocated from a mounting position. In one embodiment of the non-powered dislocation sensor 216 shown in FIG. 5, the dislocation sensor 216 may include a switch assembly (e.g., a microswitch) that comprises a sensor shaft 502 and a sensor head 504 that protrudes from a casing 506 of the body-worn device 200. The switch assembly may further include an elastic member 508 (e.g., a spring) that encircles the sensor shaft 502 and contacts the sensor head 504 and a bottom of a shaft housing 510. In this way, the elastic member 508 may be compressed when the sensor head 504 is pressed against a surface 512 at a mounting position. For example, the surface 512 may be the clothing surface of a garment or the surface of an equipment carrier, such as an accessory belt, that is worn by a person (e.g., a law enforcement officer). The body-worn device 200 may be removably attached to the garment or equipment carrier by an attachment apparatus 514, such as a clip, a stud, an adhesive, adhesive tape, or some other attachment mechanism.

As shown in view 516, the attachment of the body-worn device 200 to the surface at the mounting position by the attachment apparatus may, in addition to compressing the elastic member, also bias an electrically conductive connector portion 518 that is fixed to the sensor shaft 502 onto the conductive gap ends of an antenna coil 520. The movement of the electrically conductive connector portion 518 onto the conductive gap ends of the antenna coil 520 completes the electrical conductivity of the antenna coil 520. The antenna coil 520 may be an electrical circuit that is otherwise connected to two different electrically conductive leads of a microchip 522, in which the microchip includes a wireless transmitter 524. For example, the conductive leads may include a ground lead and a power lead. The antenna coil is connected to the microchip 522 in such a way that an external radio signal may generate an electrical current that briefly powers the microchip 522. Once powered, the microchip 522 may use the wireless transmitter 524 to broadcast a preconfigured radio signal using the antenna coil 520. In some embodiments, the preconfigured radio signal is encoded with a unique device identifier of the body-worn device 200 and a predetermined signal value.

As shown in view 526, when the body-worn device 200 dislocates from the mounting position on the surface 512, the tension in the elastic member 508 may be completely or partially released so that the sensor head 504 is urged further outside of the casing 506 by the elastic member 508. Further, this movement of the sensor head 504 also moves to the electrically conductive connector portion 518 via the connecting sensor shaft 502 so that the electrically conductive connector portion 518 disconnects from the conductive ends of the antenna coil 520 at the gap to interrupt the electrical conductively of the antenna coil 520. This interruption to the electrical conductivity of the antenna coil 520 results in the microchip being unpowered even when the antenna coil is exposed to an external radio signal. While the powered and non-powered versions of the dislocation sensor 216 as described include switch assemblies having sensor shafts, elastic members, and conductive connector portions, such structures may be substituted with other pressure-sensitive switch structures that perform similar functions in other embodiments. For example, in additional embodiments, the switch assemblies may include deformable membrane switches having flexible substrates that are deflectable by an external biasing force to conduct or interrupt the electrical flow, leaf spring switches, and/or so forth.

Returning to FIG. 2, the communication control module 220 may switch the body-worn device 200 between using the short-range wireless transceiver and the electrically conductive coupling port 206 to exchange communications with the body-worn hub 104. In order to establish a short-range wireless communication link with a body-worn hub, the communication control module 220 may use a device authentication credential (e.g., a device identifier, a secret code, a key, a digital certificate, and/or so forth) to authenticate the body-worn device 200 to the body-worn hub 104. Alternatively, or concurrently, the body-worn hub may provide a hub authentication credential to the communication control module 220 so that the module may authenticate the body-worn hub. In some embodiments, the communication control module 220 may automatically terminate a short-range wireless communication link that is established with the body-worn hub 104 when a wired connection is established with the body-worn hub 104 via the electrically conductive coupling port 206. For example, the communication control module 220 may detect that the body-worn device 200 is connected to another device via a wired connector by a detected change in one or more electrical properties (e.g., voltage, resistance, and/or current) at the electrically conductive coupling port 206. As a result, the communication control module 220 may terminate the short-range wireless communication link by powering off the short-range wireless transceiver.

In other embodiments, the communication control module 220 may further use a wired communication protocol (e.g., Universal Serial Bus (USB) protocol, TCP/IP, or some other wired communication protocol) to establish a wired communication link with the body-worn hub 104 over the wired connection. In some instances, the communication control module 220 may wait for the body-worn hub 104 to initiate the establishment of the wired communication link using the wired communication protocol. However, in other instances, the communication control module 220 may initiate the establishment of the wired communication link with the body-worn hub 104 using the wired communication protocol. Once the wired communication link is established, the communication control module 220 may terminate the short-range wireless communication link by powering off the short-range wireless transceiver.

In still other embodiments, the communication control module 220 may terminate the short-range wireless communication link when a short-range wireless communication termination command is received from the body-worn hub 104. The communication control module 220 may receive the termination command when a wired connection is established between the body-worn device 200 and the body-worn hub 104 via the electrically conductive coupling port 206. The termination command may be received via the wired connection between the body-worn device 200 and the body-worn hub 104. Accordingly, the communication control module 220 may terminate the short-range wireless communication by powering off the short-range wireless transceiver. However, in other instances, the body-worn hub 104 may simply terminate the short-range wireless communication link between the body-worn device 200 and the body-worn hub 104 at its end once the wired connection is established between the body-worn device 200 and the body-worn hub 104. In some instances, following the power off of the short-range wireless transceiver, the communication control module 220 may send a short-range wireless transceiver termination confirmation to the body-worn hub 104 via the electrically conductive coupling port 206.

Conversely, when the communication control module 220 detects that the wired connection between the body-worn device 200 and the body-worn hub 104 is terminated, the communication control module 220 may power on the short-range wireless transceiver. For example, the one or more electrical properties at the electrically conductive coupling port 206 may indicate to the communication control module 220 that the wired connection is severed. The powering on of the short-range wireless transceiver may enable the body-worn device 200 to reestablish a short-range wireless communication link with the body-worn hub 104.

Example Body-Worn Hub Components

Figure 6:
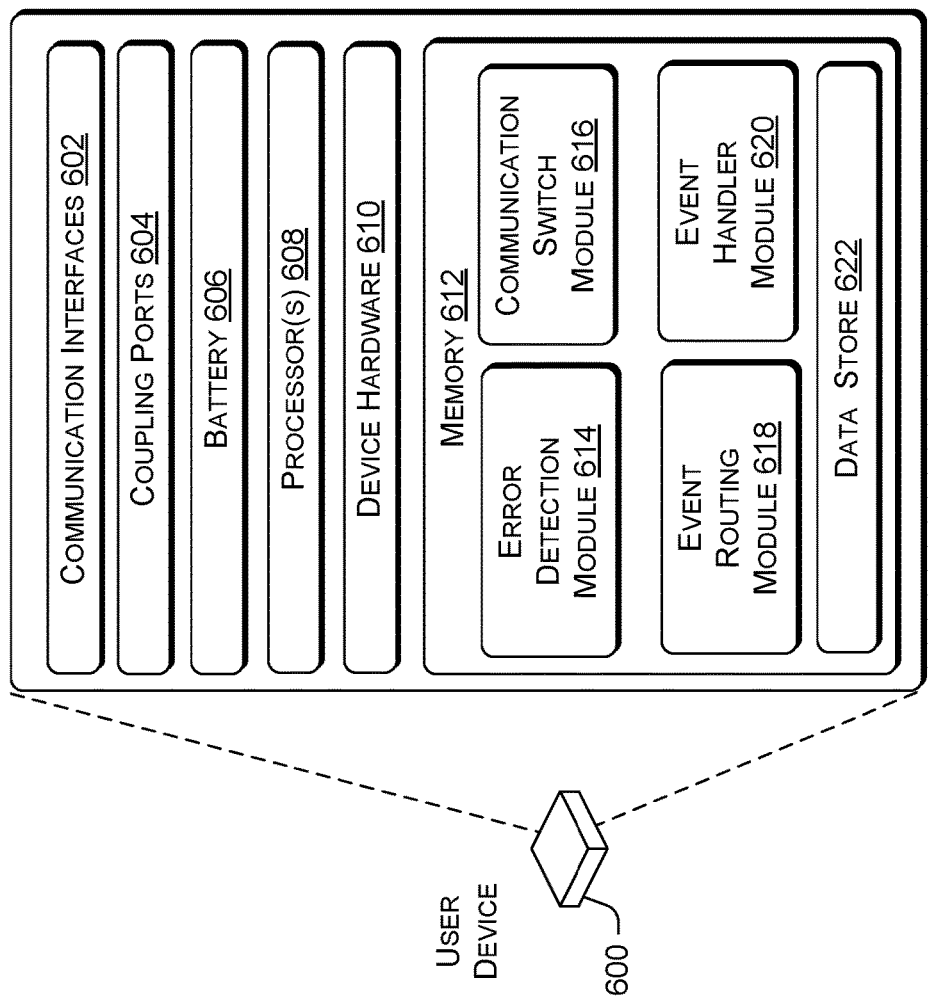
FIG. 6 is a block diagram showing various components of a user device that receives and processes event notifications from body-worn devices that indicate the body-worn devices are detached from mounting positions.

FIG. 6 is a block diagram showing various components of a user device that receive and process event notifications from body-worn devices that indicate the body-worn devices are detached from mounting positions. In some instances, the user device 600 may be the body-worn hub 104. The body-worn hub 104 may be equipped with communication interfaces 602, a set of electrically conductive coupling ports 604, a battery 606, one or more processors 608, device hardware 610, and memory 612. The communication interfaces 602 may include one or more short-range wireless communication transceivers (e.g., Bluetooth, UWB, Wi-Fi transceivers, and/or so forth), and/or one or more long-range wireless communication transceivers (e.g., cellular, satellite, and/or so forth). Each of the electrically conductive coupling ports 604 may be configured to accept an electrically conductive wired connector. The wired connector may be used by the body-worn hub 104 to receive power input from an external source, output power to an external load, as well for performing wired communications. Generally speaking, the battery 606 of the body-worn hub 104 is configured to have a larger battery capacity than the batteries of the body-worn devices.

The device hardware 610 may include signal converters, antennas, modems, hardware decoders and encoders, digital signal processors, and/or so forth that enable the body-worn hub 104 to execute applications and exchange data with other devices, such as the body-worn devices 106(1)-106(N), via wired or wireless communication. The device hardware 610 may further include a power distribution circuitry that is able to distribute power from the battery 606 to specific coupling ports based on software commands. The power distribution circuitry may also open and close electrical pathways between various coupling ports based on software commands to route power between those ports. For example, the power distribution circuitry may include a microprocessor that triggers electronic components of the circuitry to route power from a power source to a power distribution point based on software instructions.

The memory 612 may be implemented using computer-readable media, such as computer storage media. Computer-readable media includes, at least, two types of computer-readable media, namely computer storage media and communications media. Computer storage media includes volatile and non-volatile, removable, and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage, or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanisms.

The one or more processors 608 and the memory 612 of the body-worn hub 104 may implement an error detection module 614, a communication switch module 616, an event routing module 618, and an event handler module 620. These modules may include routines, program instructions, objects, and/or data structures that perform particular tasks or implement particular abstract data types. The memory 612 may further store software (e.g., drivers, applications, firmware, etc.) that support various functionalities of the body-worn hub 104, such as software that are executed by the processors 608 to support the establishment of wired and wireless communication links. The memory 612 may also provide a data store 622. The data store 622 may store the sensor data collected by the body-worn devices 106(1)-106(N). In some embodiments, an operating system may also be implemented via the one or more processors 608 and the memory 612 to perform various functions, as well as provide an execution environment that supports the executions of applications and modules.

In some embodiments, the error detection module 614 may direct a short-range wireless transceiver of the body-worn hub 104 to periodically broadcast a radio signal in the direction of a body-worn device that is equipped with a non-powered dislocation sensor. For example, the error detection module 614 may start the periodic radio signal broadcasts when an initiation command is inputted via a user interface of the body-worn hub 104. In another example, the error detection module 614 may start the periodic radio signal broadcast when the initiation command as inputted via a body-worn device (e.g., a smartphone) is received at the body-worn hub 104.

Following the broadcast of the radio signal, the error detection module 614 may use the short-range transceiver to listen for a preconfigured radio signal returned by the body-worn device. For example, the preconfigured radio signal may include a device identifier of the body-worn device with the dislocation sensor and a predetermined signal value. The error detection module 614 may then compare the device identifier to a device identifier table of one or more device identifiers and associated signal values to determine whether the device identifier is listed in the table as an authorized device identifier. The error detection module 614 may further determine whether the predetermined signal value from the returned radio signal matches the associated signal value for the authorized device identifier. The presence of a matching device identifier and signal value pair is interpreted by the error detection module 614 as an indication that the body-worn device with the matching device identifier is attached to its corresponding mounting position. The device identifier table may be stored in the data store 622. In some instances, the device identifier table may be updated or modified by the servers 116 of the NOC 114 based on the device loadout assigned to a person (e.g., law enforcement officer).

However, if the error detection module 614 determines that no return radio signal is received after a radio signal broadcast, or that a radio signal received is an incorrect radio signal that encodes a non-matching device identifier and/or a non-matching signal value, the error detection module 614 may repeat the periodic broadcast of the radio signal for a predetermined number of times. If no return radio signal is received, or no correct return radio signal is received following the predetermined number of radio signal broadcasts, the error detection module 614 may interpret the lack of any return radio signal as an indication that the body-worn device has detached from the mounting position. Accordingly, the error detection module 614 may generate an event notification indicating that the body-worn device has detached from its corresponding mounting position. In various embodiments, the error detection module 614 may send the event notification to the event routing module 618. The event notification may include a device identifier of the corresponding body-worn device that did not send the return radio signal, the time and date of the body-worn device detachment, and/or so forth.

In some instances, there may be multiple body-worn devices with powered dislocation sensors in range of the body-worn hub 104. In such instances, the transmitters in the body-worn devices may be configured to send return radio signals of different frequencies. Accordingly, the error detection module 614 may use multiple short-range wireless transceiver and/or a single short-range wireless transceiver capable of communicating using multiple short-range wireless frequencies to sequentially or concurrently broadcast radio signals to the multiple body-worn devices and receive return radio signals. Alternatively, or concurrently, each of the one or more short-range wireless transceivers of the body-worn hub 104 may be capable of broadcasting radio signals to and receiving return radio signals from different directions, such as via radio signal beamforming, in order to communicate with dislocation sensors of body-worn devices that are positioned in different places on a person.

In additional embodiments, the non-powered dislocation sensor may be further adapted for other uses. In some instances, a holster sensing device may be equipped with an additional dislocation sensor with a sensor head that uses the same or similar operating principle to detect whether a corresponding gun is holstered in or unholstered from a holster. In one example in which the holster sensing device is installed on the gun, the sensor head may detect whether the gun is in contact with the holster. Thus, contact with the holster will complete the electrical circuit of the antenna coil to enable the sending of a return radio signal, and the lack of contact with the holster will result in no return radio signal. In another example in which the holster sensing device is installed on the holster, the sensor head may detect whether the holster is in contact with the gun. Thus, contact with the gun will complete the electrical circuit of the antenna coil to enable the sending of a return radio signal, and the lack of contact with the gun will result in no return radio signal. In such instances, the return radio signal may include a device identifier of the holster sensing device and a predetermined signal value that indicates that the gun is in the holster.

Accordingly, the error detection module 614 may use a separate validation table stored in the data store 222 to determine whether the device identifier and the predetermined signal value pair matches an identifier and signal value pair stored in the validation table. The presence of a matching identifier and signal value pair is interpreted by the error detection module 614 as an indication that the gun is holstered. However, if the error detection module 614 determines that no return radio signal is received after one or more radio signal broadcasts or that a radio signal received is an incorrect radio signal that encodes a non-matching device identifier and/or a non-matching signal value, the error detection module 614 may interpret such an occurrence as an indication that the gun is unholstered. As a result, the error detection module 614 may generate an event notification indicating that the gun is unholstered and send the event notification to the event routing module 618.

The communication switch module 616 may switch the body-worn hub 104 between using the short-range wireless transceiver and a corresponding electrically conductive coupling port to exchange communications with a body-worn device. In order to establish a short-range wireless communication link with a body-worn device, the communication switch module 616 may use a device authentication credential (e.g., a device identifier, a secret code, a key, a digital certificate, and/or so forth) provided by a body-worn device to authenticate the body-worn device. Alternatively, or concurrently, the communication switch module 616 may provide a hub authentication credential to the body-worn device for the body-worn device to authenticate the body-worn hub. Thus, short-range wireless communication link may be established between the body-worn hub and the body-worn device following one-way or mutual authentication. In some embodiments, the communication switch module 616 may automatically terminate a short-range wireless communication link that is established with the body-worn device when a wired connection is established with the body-worn device via a particular coupling port of the set of electrically conductive coupling ports 206. For example, the communication switch module 616 may detect that the body-worn device is connected to a particular coupling port based on change in one or more electrical properties (e.g., voltage, resistance, and/or current) at the particular coupling port. As a result, the communication switch module 616 may send a termination command via the particular coupling port to command the body-worn device to power off its short-range transceiver.

In other embodiments, the communication switch module 616 may further use a wired communication protocol (e.g., Universal Serial Bus (USB) protocol, TCP/IP, or some other wired communication protocol) to establish a wired communication link with the body-worn hub 104 over the wired connection. In some instances, the communication switch module 616 may wait for the body-worn hub 104 to initiate the establishment of the wired communication link using the wired communication protocol. However, in other instances, the communication switch module 616 may initiate the establishment of the wired communication link with the body-worn hub 104 using the wired communication protocol. Once the wired communication link is established, the communication switch module 616 may send a termination command via the particular coupling port to command the body-worn device to power off its short-range transceiver. In some instances, when the communication switch module 616 has received short-range wireless communication termination confirmations from all body-worn devices connected to its coupling ports, the communication switch module 616 may power off its short-ranger transceiver as well to conserve battery power.

Conversely, when the communication switch module 616 detects that the wired connection between the body-worn hub 104 and at least one body-worn device is severed, the communication switch module 616 may power on the short-range wireless transceiver of the body-worn hub 104. For example, the one or more electrical properties at the electrically conductive coupling port 206 may indicate to the communication switch module 616 that the wired connection is severed. In another example, the communication switch module 616 may determine that a wired connection to a body-worn device is severed when there is a lack of a periodic keep-alive or heartbeat signal received from the body-worn device via the wired connection for a predetermined period of time. The powering on of the short-range wireless transceiver may enable the body-worn hub 104 to reestablish a short-range wireless communication link with the body-worn device with the severed wired connection.

The event routing module 618 may handle the routing of event data of events that are received from the body-worn devices, such as the body-worn devices 106(1)-106(N), as well as event data from the error detection module 614, to various recipient devices and services. In various embodiments, the event routing module 618 may route event data from one or more body-worn devices to the event handler module 620, to the vehicle hub 118, and/or to the servers 116 of the NOC 114. In some instances, an operation support application on the servers 116 may perform one or more actions in response to receiving an event notification that a body-worn device has dislocated from a mounting position. For example, when the operation support application receives an event notification indicating that a holster sensing device of a law enforcement officer has detached from a gun or a holster, the operation support application may direct a body-worn device (e.g., a smartphone) of the law enforcement officer to present a notification message. It will be appreciated that such an event notification is different from event data related to the holster sensing device with event values that indicate whether a gun is holstered in or unholstered from a holster. The notification message may request that the law enforcement officer return to a police station or a repair facility to have the holster sensing device remounted. Alternatively, or concurrently, the operation support application may also generate a work order for a repair technician at the police station or the repair facility to fix or replace the holster sending device when the officer returns.

The event routing module 618 may handle the routing of each event notification based on customizable configuration settings stored in a configuration file. For example, the configuration settings for an event notification may specify that the event notification is to be stored and/or processed at the body-worn hub 104 for generating commands to body-worn devices. In another example, the configuration settings may specify that the event notification is to be routed to the vehicle hub 118 for storage and/or processing. In an additional example, the configuration settings may specify that the event notification is to be routed to the servers 116 of the NOC 114 for storage and/or processing. In other examples, the configuration settings for the event notification may specify a combination of one or more of such routings for the event notification. In some embodiments, the event routing module 618 may receive updates or modifications to the configuration file from the servers 116 of the NOC 114 for storage in the data store 622.

The event handler module 620 may use an event handler to process event data and generate commands for at least one specific body-worn device to perform a particular action. The event data may be received from one or more body-worn devices and/or the error detection module 614. In some implementations, the event data, including indications that body-worn devices have detached from their mounting positions, may be stored in an event log for the body-worn devices. In various embodiments, the event data may be notifications received from body-worn devices that are directly connected to the body-worn hub 104, notifications received from body-worn devices connected to other hubs and forwarded by those hubs to the body-worn hub 104, and/or notifications received from the servers 116 of the NOC 114. In various embodiments, each command may include information such as a device identifier of a particular body-worn device, an action to be taken by the particular body-worn device, a time and date that the action is to be taken by the particular body-worn device, a time and date that the action is to be terminated by the particular body-worn device, and/or so forth. For example, the event handler module 620 may generate a command for the body camera 106(1) to start recording when event handler module 620 receives a notification that the gun 110 is unholstered. In another example, the event handler module 620 may generate a command for the body camera 106(1) to start recording when event handler module 620 receives a notification that the gun 110 is unholstered and the biometric monitor 106(2) detects that the heart rate of the law enforcement officer 102 is above a predetermined rate threshold. In an additional example, the event handler module 620 may generate a command for a body-worn device or another body-worn device to sound an audible alarm in response to an event notification that the body-worn device has detached from its mounting position.

In some embodiments, the event handler module 620 may generate at least one particular command in response to one or more specific events based on a customizable handler configuration file. The customizable handler configuration file may specify one or more actions to be taken and the body-worn devices that are to take the actions for different sets of one or more sets of event data. In other embodiments, the event handler module 620 may use a machine-learning algorithm to determine one or more actions to be taken and the body-worn devices that are to take the action based on different sets of one or more sets of event data. In some embodiments, the event handler module 620 may receive updates or modifications to the handler configuration profile from the servers 116 of the NOC 114 for storage in the data store 622. In additional events, the event handler module 620 may receive commands for body-worn devices that are connected to the body-worn hub 104, in which the commands that are generated by another hub or the servers 116 of the NOC 114 are based on various event data. Accordingly, the event handler module 620 may forward the commands to the body-worn devices connected to the body-worn hub 104 to trigger the body-worn devices to perform actions.

In other alternative embodiments, a body-worn device (e.g., a smartphone) or a vehicle hub may perform similar functions as described with respect to the body-worn hub 104 in FIG. 6. For example, a body-worn device, such as the body-worn device 200, may be equipped with modules that are similar in function to the modules 614-620 of the body-worn hub 104.

Example Processes

Figure 7:
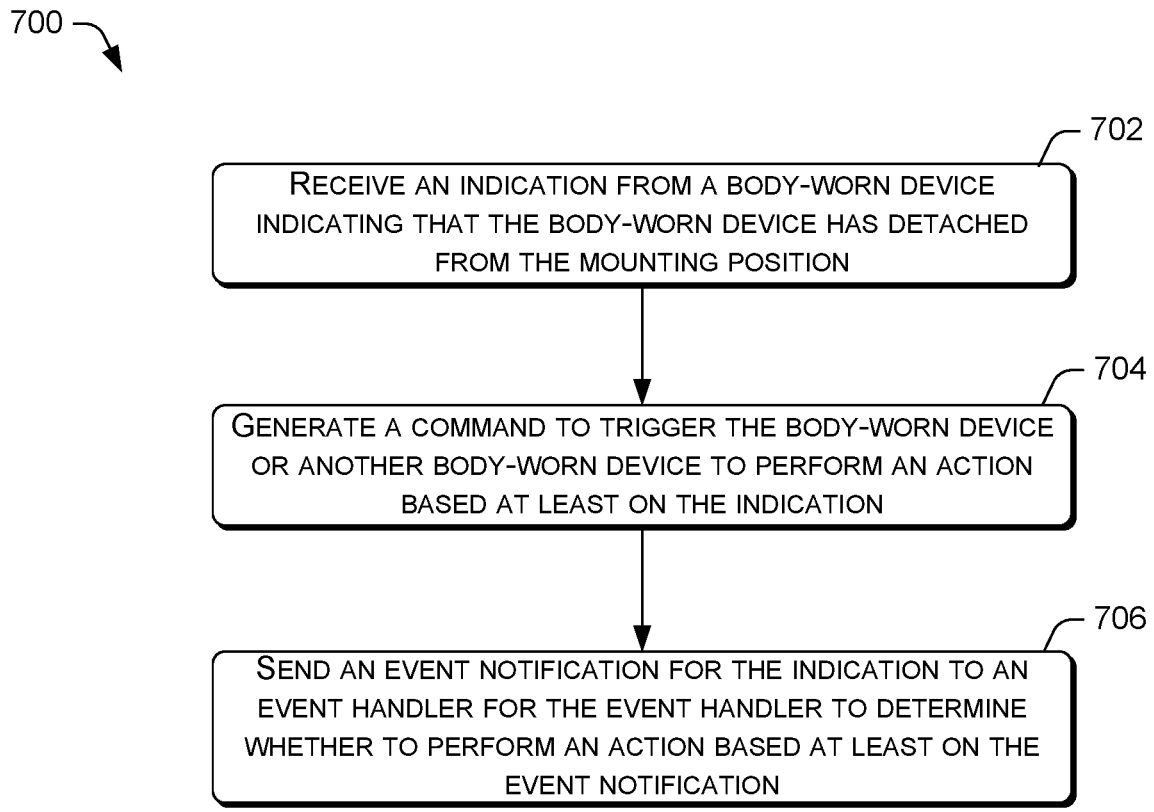
FIG. 7 is a flow diagram of an example process for a user device to receive and process an event notification from a body-worn device that indicates the body-worn device is detached from a mounting position.
Figure 8:
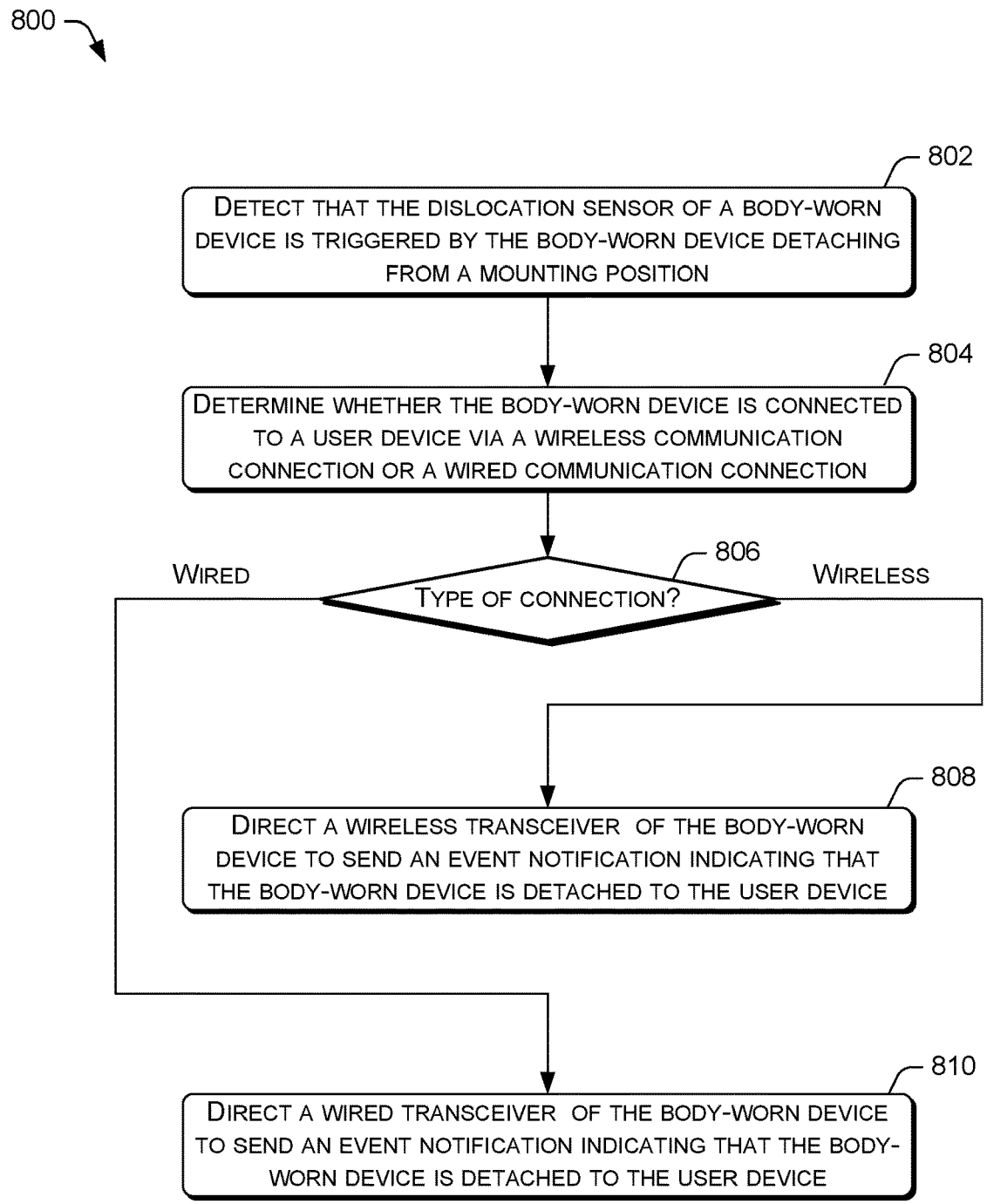
FIG. 8 is a flow diagram of an example process for a body-worn device to notify a user device that the body-worn device is detached from a mounting position based on the triggering of a powered dislocation sensor.
Figure 9:
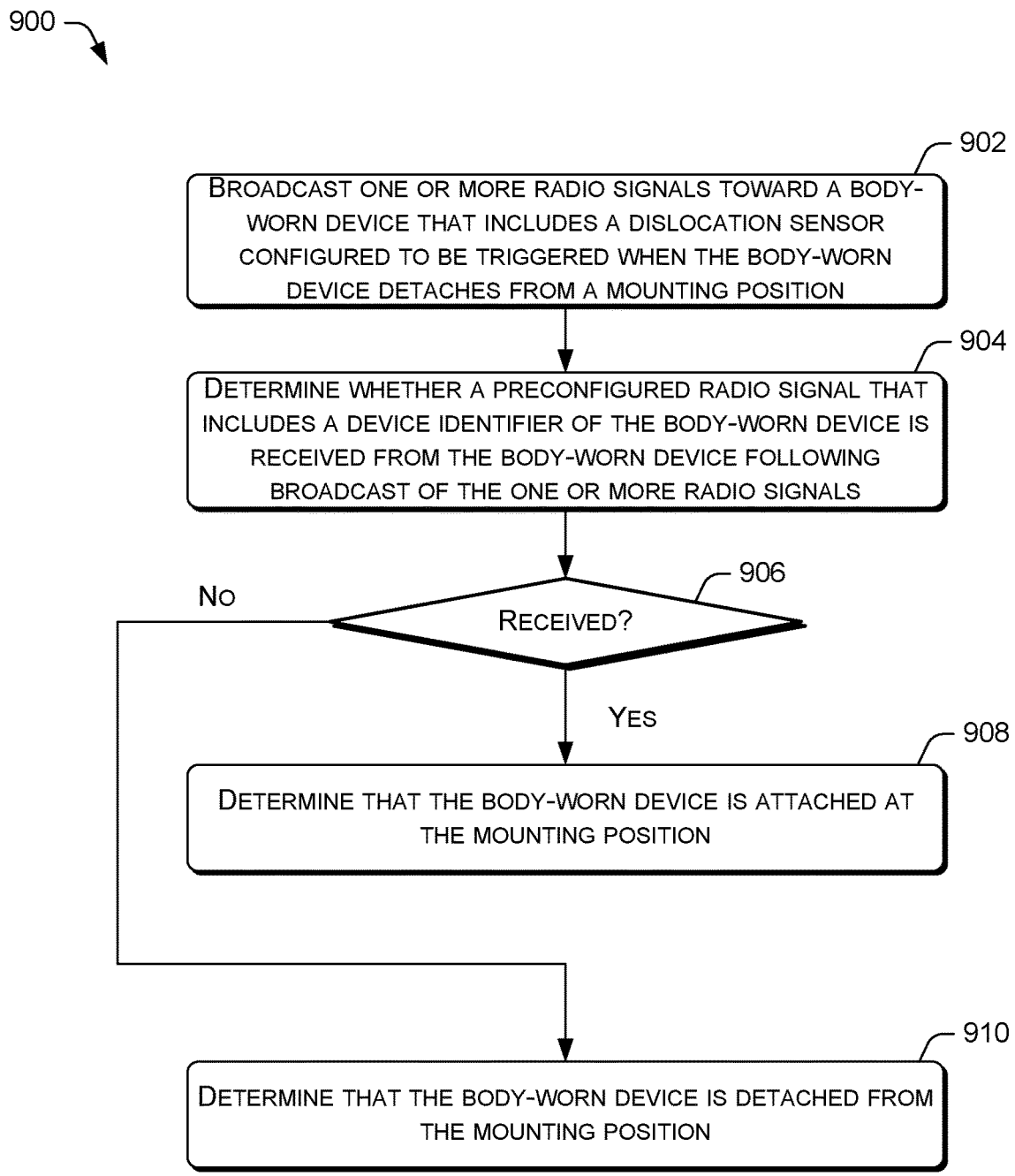
FIG. 9 is a flow diagram of an example process for a user device to determine that a body-worn device with a non-powered dislocation sensor is detached from a mounting position.

FIGS. 7-9 present illustrative processes 700-900 for detecting the device dislocation of a body-worn device using powered and non-powered dislocation sensors. Each of the processes 700-900 is illustrated as a collection of blocks in a logical flow chart, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or in parallel to implement the process. For discussion purposes, the processes 700-900 are described with reference to the environment 100 of FIG. 1.

FIG. 7 is a flow diagram of an example process 700 for a user device to receive and process an event notification from a body-worn device that indicates the body-worn device is detached from a mounting position. In various embodiments, the user device may be a body-worn hub or a body-worn device. At block 702, the user device may receive an indication from a body-worn device indicating that the body-worn device has detached from the mounting position. In some instances, the indication may be an event notification from a body-worn device with a powered dislocation sensor. In other instances, the indication may be an absence of a preconfigured return radio signal from a body-worn device with a non-powered dislocation sensor. At block 704, the user device may generate a command to trigger the body-worn device or another body-worn device to perform an action based at least on the indication. For example, the user device may generate a command for a body-worn device or another body-worn device to sound an audible alarm.

At block 706, the user device may send an event notification for the indication to an event handler for the event handler to determine whether to perform an action based at least on the event notification. In some instances, the event notification may be an event notification that the user device received from a body-worn device with a powered dislocation sensor. In other instances, the event notification may be generated by the user device based on the absence of a preconfigured return radio signal from a body-worn device with a non-powered dislocation sensor. In various embodiments, the event handler may be an event handler that is executed by an additional hub, such as a vehicle, or a server at a NOC.

FIG. 8 is a flow diagram of an example process 800 for a body-worn device to notify a user device that the body-worn device is detached from a mounting position based on the triggering of a powered dislocation sensor. At block 802, the body-worn device may detect that the dislocation sensor of the body-worn device is triggered by the body-worn device detaching from a mounting position. In various embodiments, the dislocation sensor may be a powered dislocation sensor. The triggering of the dislocation sensor may complete or interrupt an electrical circuit that is detected by a processor of the body-worn device. The triggering of the dislocation sensor may cause the body-worn device to generate an event notification indicating that the body-worn device has detached from a mounting position.

At block 804, the body-worn device may determine whether the body-worn device is connected to a user device via a wireless communication connection or a wired communication connection. In various embodiments, the user device may be a body-worn hub, a vehicle hub, or another body-worn device. At decision block 806, if the body-worn device is connected to the user device via a wireless communication connection, the process 800 may proceed to block 808. At block 808, the body-worn device may direct a wireless transceiver of the body-worn device to send an event notification indicating that the body-worn device is detached from the mounting position to the user device. Returning to decision block 806, if the body-worn device is connected to the user device via a wired communication connection, the process 800 may proceed to block 810. At block 810, the body-worn device may direct a wired transceiver of the body-worn device to send an event notification indicating that the body-worn device is detached from the mounting position to the user device.

FIG. 9 is a flow diagram of an example process 900 for a user device to determine that a body-worn device with a non-powered dislocation sensor is detached from a mounting position. At block 902, a user device may broadcast one or more radio signals toward a body-worn device that includes a dislocation sensor configured to be triggered when the body-worn device detaches from a mounting position. At block 904, the user device may determine whether a preconfigured radio signal that includes a device identifier of the body-worn device is received from the body-worn device following the broadcast of the one or more radio signals.

At decision block 906, if the user device determines that the preconfigured radio signal is received ("yes" at decision block 906), the process 900 may proceed to block 908. At block 908, the user device may determine that the body-worn device is attached at the mounting position. In various embodiments, the preconfigured radio signal may be a signal that encodes a unique user identifier of the body-worn device and a correct signal value for the body-worn device.

However, if the user device determines that no preconfigured radio signal is received ("no" at decision block 906), the process 900 may proceed to block 910. At block 910, the user device may determine that the body-worn device is detached from the mounting position. In various embodiments, if no return radio signal is received after a radio signal broadcast by the user device, or if a radio signal is received that is an incorrect radio signal that encodes a non-matching device identifier and/or a non-matching signal value, the user device may repeat the periodic broadcast of the radio signal for a predetermined number of times. If no return radio signal is received, or no correct return radio signal is received following the predetermined number of radio signal broadcasts, the user device may interpret the lack of any return radio signal as an indication that the body-worn device has detached from the mounting position.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A system, comprising:
a user device;
a first body-worn device;
a second body-worn device, comprising:
a transceiver;
a dislocation sensor that is triggered when the second body-worn device detaches from a mounting position;
one or more processors; and
memory having instructions stored therein, the instructions, when executed by the one or more processors, cause the one or more processors to perform acts comprising:
detecting that the dislocation sensor is triggered by the second body-worn device detaching from the mounting position; and
directing the transceiver to send an event notification to the user device indicating that the second body-worn device has detached from the mounting position, wherein the event notification causes the user device to generate a command that is sent by the user device to the first body-worn device to further trigger the first body-worn device to present a notification message indicating that the second body-worn device is detached from the mounting position.

2. The system of claim 1, wherein the transceiver of the second body-worn device includes a short-range wireless transceiver and the dislocation sensor includes a switch that completes or interrupts an electrical circuit when the second body-worn device detaches from the mounting position, and the directing includes directing the short-range wireless transceiver to send an error signal to the user device when the one or more processors detect that the electrical circuit is completed or interrupted.

3. The system of claim 1, wherein the transceiver of the second body-worn device includes a wired transceiver and the dislocation sensor includes a switch that completes or interrupts an electrical circuit when the second body-worn device detaches from the mounting position, and the directing includes directing the wired transceiver to send an error signal to the user device when the one or more processors detect that the electrical circuit is completed or interrupted.

4. The system of claim 1, wherein the transceiver of the second body-worn device includes a wired transceiver and the dislocation sensor includes a switch that completes or interrupts an electrical circuit when the second body-worn device detaches from the mounting position, and the directing includes directing the wired transceiver to stop periodically sending a normal status signal when the one or more processors detect that the electrical circuit is completed or interrupted.

5. The system of claim 1, wherein a failure of the transceiver of the second body-worn device to send the normal status signal after a predetermined period of time is determined by the user device as an indication that the second body-worn device has detached from the mounting position.

6. The system of claim 1, wherein the dislocation sensor of the second body-worn device includes a switch that completes or interrupts an electrical circuit when an elastic portion of the switch is moved by the detachment of the second body-worn device from the mounting position.

7. The system of claim 6, wherein the switch is a spring-loaded electrical switch or a deformable membrane electrical switch.

8. The system of claim 1, wherein the second body-worn device is a holster sensing device and the mounting position is a position on a gun or a gun holster.

9. The system of claim 1, wherein the second body-worn device is a body camera or a radio, and wherein the mounting position is a position on a clothing item, equipment belt, or protective equipment.

10. A body-worn device, comprising:
   a microchip that includes a wireless transmitter, the wireless transmitter being configured to send out a preconfigured radio signal in response to receiving electrical power;
   an antenna coil that is configured to be energized by an external radio signal broadcasted by a wireless transceiver of a user device to provide the electrical power to the wireless transmitter and to broadcast the preconfigured radio signal from the wireless transmitter; and
   a dislocation sensor that includes a switch, the switch configured to interrupt an electrical circuit of the antenna coil when the body-worn device detaches from a mounting position.

11. The body-worn device of claim 10, wherein the preconfigured radio signal encodes a device identifier that is stored in the microchip to uniquely identify the body-worn device.

12. The body-worn device of claim 10, wherein the user device broadcasts the external radio signal to the antenna coil of the body-worn device on a periodic basis.

13. The body-worn device of claim 12, wherein a failure of the wireless transceiver to broadcast the preconfigured radio signal after a predetermined number of external radio signal broadcasts is determined by the user device as an indication that the body-worn device has detached from the mounting position.

14. The body-worn device of claim 12, wherein a failure of the wireless transceiver to broadcast the preconfigured radio signal after a predetermined number of external radio signal broadcasts triggers the user device to send an event notification that indicates the body-worn device has detached from the mounting position to an additional hub or a server.

15. The body-worn device of claim 10, wherein the switch includes an elastic portion that pushes a conductive portion of the switch away from the antenna coil when the body-worn device detaches from the mounting position to produce a non-conductive gap in the electrical circuit of the antenna coil.

16. The body-worn device of claim 15, wherein the switch is a spring-loaded electrical switch or a deformable membrane electrical switch.

17. The body-worn device of claim 10, wherein the body-worn device is a holster sensing device and the mounting position is a position on a gun or a gun holster.

18. The body-worn device of claim 10, wherein the body-worn device is a body camera or a radio, and wherein the mounting position is a position on a clothing item or protective equipment.

19. A computer-implemented method, comprising:
   broadcasting, by a wireless transceiver of a user device, radio signals to a body-worn device to energize a wireless transmitter of dislocation sensor of a body-worn device that is configured to transmit normal status signals in response to the radio signals, the normal status signals indicating that the body-worn device is not dislocated from a mounting position;
   determining, at a user device, that a body-worn device has detached from the mounting position in response to the user device failing to receive, following a broadcast of one or more radio signals by the user device to the body-worn device, a normal status signal from the body-worn device indicating that the body-worn device is not dislocated from the mounting position; and
   generating, at the user device, a command to trigger the body-worn device or another body-worn device to perform an action based at least on the indication.

20. The computer-implemented method of claim 19, further comprising sending, via the user device, an event notification for the indication to an event handler on a hub or a server for the event handler to determine whether to perform an action based at least on the event notification.

* * * * *